US011899359B2

(12) United States Patent
Baur et al.

(10) Patent No.: US 11,899,359 B2
(45) Date of Patent: Feb. 13, 2024

(54) METHOD AND APPARATUS FOR REMOVING A PARTICLE FROM A PHOTOLITHOGRAPHIC MASK

(71) Applicant: Carl Zeiss SMT GmbH, Oberkochen (DE)

(72) Inventors: Christof Baur, Darmstadt (DE); Hans Hermann Pieper, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/838,520

(22) Filed: Jun. 13, 2022

(65) Prior Publication Data

US 2022/0357653 A1  Nov. 10, 2022

Related U.S. Application Data

(60) Division of application No. 17/074,042, filed on Oct. 19, 2020, now Pat. No. 11,429,020, which is a
(Continued)

(30) Foreign Application Priority Data

Apr. 24, 2018  (DE) .......................... 102018206278.1

(51) Int. Cl.
*G03F 1/82*  (2012.01)
*G03F 7/00*  (2006.01)

(52) U.S. Cl.
CPC ............ *G03F 1/82* (2013.01); *G03F 7/70925* (2013.01)

(58) Field of Classification Search
CPC .......... G03F 1/82; G03F 7/70925; G03F 1/22
See application file for complete search history.

(56) References Cited

U.S. PATENT DOCUMENTS 5,047,649 A * 9/1991 Hodgson ............. H01J 37/3174
250/307
5,634,230 A  6/1997 Maurer
(Continued)

FOREIGN PATENT DOCUMENTS

DE  102016203094  8/2017
DE  102017205629  10/2018
(Continued)

OTHER PUBLICATIONS

Machine translation of JP 2005084582 (Year: 2005).*
(Continued)

*Primary Examiner* — Erin F Bergner
(74) *Attorney, Agent, or Firm* — Fish & Richardson P.C.

(57) ABSTRACT

The present application relates to a method for removing a particle from a photolithographic mask, including the following steps: (a) positioning a manipulator, which is movable relative to the mask, in the vicinity of the particle to be removed; (b) connecting the manipulator to the particle by depositing a connecting material on the manipulator and/or the particle from the vapor phase; (c) removing the particle by moving the manipulator relative to the photolithographic mask; and (d) separating the removed particle from the manipulator by carrying out a particle-beam-induced etching process which removes at least a portion of the manipulator.

16 Claims, 32 Drawing Sheets

Related U.S. Application Data continuation of application No. PCT/EP2019/058873, filed on Apr. 9, 2019.

(56) References Cited

U.S. PATENT DOCUMENTS

| | | |
|---|---|---|
| 6,812,460 B1 | 11/2004 | Stallcup, II et al. |
| 8,696,818 B2 | 4/2014 | Robinson et al. |
| 2008/0149832 A1 | 6/2008 | Zorn |
| 2009/0025465 A1 | 1/2009 | Kaya et al. |
| 2009/0241274 A1 | 10/2009 | Chun |
| 2010/0186768 A1 | 7/2010 | Kanamitsu |
| 2011/0279799 A1 | 11/2011 | Singer et al. |
| 2016/0263632 A1* | 9/2016 | Robinson .......... G03F 1/84 |
| 2016/0274145 A1 | 9/2016 | Borromeo et al. |
| 2017/0248842 A1 | 8/2017 | Oster et al. |
| 2017/0256380 A1 | 9/2017 | Brogden et al. |
| 2017/0292923 A1 | 10/2017 | Baralia et al. |
| 2018/0284600 A1 | 10/2018 | Steigerwald et al. |
| 2021/0048744 A1 | 2/2021 | Baur et al. |

FOREIGN PATENT DOCUMENTS

| | | | |
|---|---|---|---|
| JP | 2005-084582 | 3/2005 | |
| JP | 2007-027195 | 2/2007 | |
| JP | 2010-170019 | 8/2010 | ............... G03F 1/08 |
| JP | 2016-072517 | 5/2016 | |
| KR | 10-2011-0069083 | 6/2011 | ............... G03F 7/20 |
| KR | 1020170115971 | 10/2017 | |

OTHER PUBLICATIONS

R. Requicha: "Nanomanipulation with the atomic force microscope," Nanotechnology Online, ISBN: 9783527628155 (Jul. 15, 2010).

M. Schaffer et al. "Sample preparation for atomic-resolution STEM a low voltages by FIB", *Ultramicroscopy*, vol. 114, pp. 62-71 (2012).

J. Xu et al., "Lifting and sorting of charged Au nanoparticles by electrostatic forces in atomic force microscopy", *Small*, vol. 6, No. 19, pp. 2105-2108 (2010).

Notice of Reasons for Rejection issued by the Korean Intellectual Property Office for Application No. KR 10-2020-7033219, dated Nov. 29, 2022 (English Translation).

Notice of Allowance issued by the Korean Parent Office for Application No. KR 10-2020-7033219, dated Oct. 27, 2023 (with English Translation).

\* cited by examiner

METHOD AND APPARATUS FOR REMOVING A PARTICLE FROM A PHOTOLITHOGRAPHIC MASK

CROSS-REFERENCE TO RELATED APPLICATIONS

This application is a divisional of and claims priority under 35 U.S.C. § 121 to U.S. application Ser. No. 17/074,042, filed on Oct. 19, 2020, which is a continuation of PCT Application No. PCT/EP2019/058873, filed on Apr. 9, 2019, which claims priority from German Application DE 10 2018 206 278.1, filed on Apr. 24, 2018. The entire contents of each of these priority applications are incorporated herein by reference.

TECHNICAL FIELD

The present disclosure relates to a method and an apparatus for removing a particle from a photolithographic mask.

BACKGROUND

As a consequence of the growing integration density in the semiconductor industry, photolithography masks have to image increasingly smaller structures on wafers. In terms of photolithography, the trend towards growing integration density is addressed by shifting the exposure wavelength of photolithography systems to ever shorter wavelengths. Currently frequently used as a light source in photolithography systems or lithography systems is an ArF (argon fluoride) excimer laser that emits at a wavelength of approximately 193 nm.

Lithography systems are being developed today that use electromagnetic radiation in the EUV (extreme ultraviolet) wavelength range (preferably in the range of 10 nm to 15 nm). Said EUV lithography systems are based on a completely new beam guiding concept which uses reflective optical elements, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist arranged on a wafer is due to photolithographic masks, exposure masks, photomasks or just masks. With every further increase in integration density, it becomes increasingly more important to reduce the minimum structure size of the exposure masks. The production process of photolithographic masks therefore becomes increasingly more complex and as a result more time-consuming and ultimately also more expensive. Due to the minute structure sizes of the pattern elements, defects during mask production cannot be ruled out. These are typically repaired—whenever possible. Repairing photomasks involves removing parts of an absorber pattern which are present at mask locations not provided by the design. Furthermore, absorbing material is deposited at locations on the mask which are free of absorbing material even though the mask design provides absorbing pattern elements. Both types of repair processes can produce debris fragments or particles which can settle on transparent or reflective locations of photomasks and which can be visible as imaging aberrations on a wafer.

However, dirt particles from the environment which settle on the surface of a mask are more important. These are removed as standard from the surface of the masks by cleaning steps during mask production and during operation of the masks. FIG. 1 shows a plan view of a section of a photomask, which has a particle that is arranged on a pattern element of the mask and that can be removed by use of a cleaning process. Moreover, particles that can settle on the mask can be produced by the handling of a mask during the production process and/or the operation thereof.

The decreasing structural dimensions of photolithographic masks are increasing the difficulty of cleaning processes. Moreover, as a result of the decreasing exposure wavelength, ever smaller foreign or dirt particles adsorbed on the surface of the mask are becoming visible during an exposure process on a wafer. FIG. 2 schematically shows a section of a mask in which two particles that are localized in a contact hole of the photomask cannot be removed from the mask with the aid of a cleaning process.

A further option for removing particles from a photomask lies in loosening or releasing the particles to be removed from the surface of the mask. To this end, use is often made of a micro-manipulator or the measuring tip of a scanning probe microscope. Then, the particles are removed in a second process step by use of a cleaning process. Thereafter, a check has to be carried out in a third step as to whether the particle or particles were in fact removed from the mask.

Some documents that examine the movement of nanoparticles with the aid of a nano-manipulator or micro-manipulator, for instance the measuring tip of a scanning probe microscope, are mentioned below in exemplary fashion: H. H. Pieper: "Morphology and electric potential of pristine and gold covered surfaces with fluorite structure," Thesis, University of Osnabruck 2012; S. Darwich et al.: "Manipulation of gold colloidal nanoparticles with atomic force microscopy in dynamic mode: influence of particle—substrate chemistry and morphology, and operating conditions," Beilstein J. Nanotechnol., vol. 2 (2011), p. 85-98; H. H. Pieper et al.: "Morphology and nanostructure of CeO2(111) surfaces of single crystals and Si(111) supported ceria films," Phys. Chemistry Chemical Physics, vol. 14, p. 15361ff, 2013; E. Gallagher et al.: "EUVL mask repair: expanding options with nanomachining," BACUS, vol. 3, no. 3 (2013), p. 1-8; M. Martin et al.: "Manipulation of Ag nanoparticles utilizing noncontact atomic force microscopy," Appl. Phys. Lett., vol. 72, no. 11, September 1998, p. 1505-1507; P. J. Durston et al.: "Manipulation of passivated gold clusters on graphite with the scanning tunneling microscope," Appl. Phys. Lett., vol. 72, no. 2, January 1998, p. 176-178; R. Requicha: "Nanomanipulation with the atomic force microscope," Nanotechnology Online, ISBN: 9783527628155; C. Baur et al.: "Nanoparticle manipulation by mechanical pushing: underlying phenomena and real-time monitoring," Nanotechnology 9 (1998), p. 360-364; J. D. Beard et al.: "An atomic force microscope nanoscalpel for nanolithography and biological applications," Nanotechnology 20 (2009), 445302, p. 1-10; U.S. Pat. No. 6,812,460 B1.

In the article "Lifting and sorting of charged Au nanoparticles by electrostatic forces in atomic force microscopy," small 2010, vol. 6, no. 19, p. 2105-2108, the authors J. Xu et al. report about lifting nanoparticles off a surface by use of a non-conductive measurement probe of a scanning force microscope with a back-side metallic tempering layer, by applying a corresponding potential to the metallic tempering layer.

The US patent specification U.S. Pat. No. 8,696,818 B2 describes a system for removing debris fragments from a surface of a photolithographic mask. A measuring tip of a probe of a scanning microscope is coated with a material having low surface energy and is moved over the surface of the mask. The debris fragments adhere physically to the coated measuring tip and are removed from the surface of the mask together with the measuring tip.

In addition to the above-described methods, a particle that cannot be removed by a cleaning process can be removed with the aid of a local etching process. The difficulty of this procedure lies in the fact that, as a rule, the composition of the particle to be removed is unknown. Therefore, the local etching process can only be partly matched to the particle to be removed, or not at all. Therefore, the local etching process is often time-consuming and fairly frequently without success. Moreover, as described above, a second measuring appliance is typically used after the local etching process has been carried out to check whether the removal process of the particle could be carried out successfully.

The in-situ lift-out method is known from a completely different technical field, namely that of preparing TEM (transmission electron microscope) samples; here, a TEM sample is connected to a micromanipulator for transportation purposes. The documents specified below in exemplary fashion relate to the production of TEM samples: J. Mayer et al.: "TEM sample preparation and FIB-induced damage," MRS Bulletin, vol. 32, May 2007, p. 400-407; B. Myers: "TEM Sample Preparation with the FIB/SEM," Nuance Center, Northwestern University—Evanston, 2009; M. Schaffer et al.: "Sample preparation for atomic STEM at low voltages by FIB," Ultramicroscopy, vol. 114, p. 62-71 (2012); and US 2017/0256380 A1.

The above-described multi-stage process of particle removal is a lengthy (approximate duration: four hours) and hence high-cost process as a result of the sequential use of a plurality of different appliances.

US patent application US 2010/0186768 A1 describes the deposition of material on a particle such that the enlarged particle can be released from the surface of a photolithographic mask using a cleaning process or by way of a mechanical displacement by the measuring tip of a scanning force microscope.

The Japanese patent application JP 2005-084582 describes the removal of a particle from a photomask using a dynamic or electromagnetic interaction, or a chemical reaction, between a probe of a scanning force microscope and the particle.

The present invention therefore addresses the problem of specifying methods and apparatuses that allow an improvement in the removal of particles from photolithographic masks.

SUMMARY

According to exemplary embodiments of the present invention, this problem is solved by methods and apparatuses described below. In a first embodiment, a method for removing a particle from a photolithographic mask includes the following steps: (a) positioning a manipulator, which is movable relative to the mask, in the vicinity of the particle to be removed; (b) connecting the manipulator to the particle by depositing a connecting material on the manipulator and/or the particle from the vapor phase; (c) removing the particle by moving the manipulator relative to the photolithographic mask; and (d) separating the removed particle from the manipulator by carrying out a particle-beam-induced etching process which removes at least a portion of the manipulator.

Carrying out a method according to the invention connects a manipulator to a particle to be removed. Thereupon, the particle can be moved in defined fashion and consequently be removed from a photolithographic mask. The painstaking displacement of a particle with a micromanipulator, which is susceptible to errors, is avoided. Moreover, the time-consuming inspection of the photomask, which checks whether the disturbing particle was in fact removed, can be dispensed with. There is a minor modification to the manipulator during the separating process. However, this does not prevent a single manipulator being able to be used to remove a number of particles.

The deposition of the connecting material for connecting the manipulator to the particle does not preclude other interactions from coupling the particle to the manipulator. By way of example, an electrostatic interaction and/or a van der Waals interaction between the manipulator and the particle come into question here.

The method further can include the step of: depositing a sacrificial tip on the manipulator.

A manipulator can be used to remove many particles as a result of the deposition of a sacrificial tip on the manipulator. Should the sacrificial tip have become unusable after a number of particle pick-ups, said sacrificial tip can be removed from the manipulator, for example by a local etching process, and be replaced by the deposition of a new sacrificial tip on the manipulator.

Depositing the sacrificial tip can comprise the application of at least one of the following steps: a particle-beam-induced deposition process and a deposition process induced by an electric field.

A particle-beam-induced deposition process can be induced by at least one element of the following group: an electron beam, an ion beam, an atomic beam, a molecule beam and a photon beam.

An electron-induced reaction can be triggered by field emission by applying a suitable voltage to a tip or a measuring tip of a manipulator and by providing a precursor gas. The sacrificial tip is predominantly deposited in the direction of the strongest electric field.

The manipulator can have a measuring tip for examining the photolithographic mask and the method can further include the following step: placing the sacrificial tip on the measuring tip.

By way of a measuring tip attached to the manipulator, the above-described method facilitates the detection of a particle disturbing the imaging of the photomask in a first step and, after the deposition of the sacrificial tip on the manipulator, the removal of the disturbing particle from the photolithographic mask in a second step. Both steps can be carried out in a single apparatus. It is possible to avoid the transportation to a second apparatus and the alignment of the second apparatus in respect of the bothersome particle, which should therefore be removed.

Further, the deposition of the sacrificial tip on the measuring tip of the manipulator simplifies the deposition of the sacrificial tip by field emission. Moreover, the deposition of the sacrificial tip on the measuring tip increases the distance between the tip of the sacrificial tip and the manipulator and hence also renders possible the removal of particles at points of a photolithographic mask that are difficult to access.

The sacrificial tip can have a length in a range of 5 nm to 5000 nm, preferably 10 nm to 2000 nm, more preferably 20 nm to 1000 nm, and most preferably of 50 nm to 500 nm. The sacrificial tip can have a cylindrical form with a diameter in a range of 1 nm to 1000 nm, preferably 2 nm to 500 nm, more preferably 5 nm to 200 nm, and most preferably of 10 nm to 100 nm.

The sacrificial tip can be carbon-based. A precursor gas for depositing sacrificial tips can comprise at least one element of the following group: ethene, styrene, pyrene, hexadecane, liquid paraffins, formic acid, acrylic acid, propionic acid, methylmethacrylate.

A sacrificial tip can be electrically conductive. A precursor gas for depositing an electrically conductive sacrificial tip can comprise a metal carbonyl. A metal carbonyl can comprise at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

A sacrificial tip can have features that make the removal of a particle from the tip of a sacrificial tip easier or that simplify this process. These features can comprise constrictions and/or markings that specify positions at which a particle-beam-induced etching process can separate the particle and a part of the tip of the sacrificial tip from the remaining main part.

In an alternative embodiment, provision is made of a manipulator that already has a sacrificial tip. In a first exemplary embodiment, the manipulator is replaced after the sacrificial tip has been used up. In a second exemplary embodiment, the used-up sacrificial tip is removed from the manipulator and replaced by the deposition of a new sacrificial tip on the manipulator.

The particle can comprise a diameter of 1 nm to 10 μm, preferably 5 nm to 5 μm, more preferably 10 nm to 2 μm, and most preferably 15 nm to 1 μm.

The positioned manipulator and the particle to be removed can have a spacing of 0 nm to 5000 nm, preferably 0 nm to 2000 nm, more preferably 0 nm to 1000 nm, and most preferably of 0 nm to 500 nm.

According to a second embodiment, the method for removing a particle from a photolithographic mask includes the following steps: (a) positioning a manipulator, which is movable relative to the mask, in the vicinity of the particle to be removed; (b) connecting the manipulator to the particle by depositing a connecting material on the manipulator and/or the particle from the vapor phase, wherein a particle beam that induces the deposition is provided through the manipulator; and (c) removing the particle by moving the manipulator relative to the photolithographic mask.

In this embodiment, the particle beam inducing the deposition need not be tipped from the normal direction in respect of the photomask. Further, the manipulator in this embodiment requires no tip and/or sacrificial tip. As a result, the deposition of a sacrificial tip on the manipulator can be avoided.

The manipulator can have an opening, and/or a particle beam that induces the deposition can be provided through the opening of the manipulator. Through the opening, the particle beam inducing the deposition can induce the deposition of a sacrificial tip on the side of the manipulator facing away from the electron beam. The particle beam inducing the deposition can induce the deposition of the connecting material through the opening.

Consequently, an opening in a manipulator can be exploited in two different ways. Firstly, this simplifies the deposition of a sacrificial tip on the side of the manipulator lying opposite the incidence of the inducing particle beam. Secondly, the opening of the manipulator can be used for aligning the manipulator relative to the particle and for connecting the manipulator to the particle.

The connecting material can be deposited on at least one edge of the opening of the manipulator.

The method of the second embodiment further can include the step of: separating the removed particle from the manipulator by carrying out a particle-beam-induced etching process in the region of the connecting material. The particle-beam-induced etching process can remove the connecting material between the manipulator and the particle.

This embodiment has the advantage of the manipulator being available for further particle removal processes in substantially unmodified fashion after the removal of a particle. Moreover, the opening can be used for positioning or aligning the manipulator and particle.

The opening can have any form. Symmetrical openings, such as, for instance, circular, triangular, rectangular or square openings, are preferred. The diameter of the opening of the manipulator should be smaller than the diameter of the particle.

Step b. of the method according to the disclosure can comprise: provision of a precursor gas in the region of the particle and the manipulator.

A precursor gas for depositing connecting material can comprise at least one element of the following group: ethene, styrene, pyrene, hexadecane, liquid paraffins, formic acid, acrylic acid, propionic acid, methylmethacrylate.

It is advantageous if the connecting material has a large carbon component. A large carbon component of the connecting material results in a hard connecting material. Carbon or materials predominantly containing carbon can easily be etched by use of water vapor and, as a result, facilitate a simple separation of the particle to be removed from the manipulator or the sacrificial tip of the manipulator. Moreover, connecting materials which predominantly or at least partly comprise carbon form volatile compounds when separating the connection between sacrificial tip and particle or between manipulator and particle, namely the carbon oxides of $CO_2$ (carbon dioxide) and $CO$ (carbon monoxide), which can easily be removed from the reaction region.

The connecting material can be electrically conductive. A precursor gas for depositing an electrically conductive connecting material can comprise a metal carbonyl. A metal carbonyl can comprise at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$). The precursor gas diethyl ruthenocene ($C_{14}H_{18}Ru$) can be used for the purposes of depositing ruthenium.

Step b. of the method according to the invention can comprise: providing a means in the region of the particle and of the manipulator for the purposes of modifying the precursor gas such that the connecting material is deposited.

The means can comprise at least one of the following elements: a focused particle beam and an electric field between the particle and the manipulator.

The particle beams specified above in the context of depositing a sacrificial tip can be used as particle beams. An electron-beam-induced deposition process is advantageous in that the deposition reaction can be localized precisely. Moreover, an electron beam that induces a deposition process substantially does not damage the sample, i.e., the photomask, on which a disturbing particle is situated.

Here and elsewhere in this application, the expression "substantially" denotes an indication of a measurement variable within its error tolerances when the measurement variable is measured using measuring instruments in accordance with the prior art.

A voltage between the sacrificial tip and the particle can be applied to a conductive sacrificial tip of a manipulator. By setting the voltage, electrons that are released from the particle or the sacrificial tip by field emission can induce a local deposition reaction of a precursor gas between the sacrificial tip and the particle.

The connecting material can form a connection between the manipulator and the particle, said connection being detachable to a restricted extent or not detachable.

It is expedient if the connecting material forms a connection that is detachable to a restricted extent between the manipulator or the sacrificial tip of the manipulator and the particle. In this case, the manipulator can be used for successively removing a number of particles. However, it is also possible for the connecting material to realize a non-detachable connection between the manipulator and the particle. In this case, the manipulator that has been loaded with a particle is replaced with a new manipulator.

For the purposes of depositing the connecting material, the particle beam can pass through the manipulator.

The methods according to the invention of both embodiments can further include the step of: analyzing a material of the removed particle.

A particle can only be examined to a very restricted extent on a sample, for example on a photomask. Firstly, particles are often localized at points of the mask that are difficult to access. Secondly, the analysis options in situ are very restricted since, of course, the analysis of the particle should not modify the surrounding region of the mask on the one hand. The examination of a particle with the aid of energy-dispersive x-ray spectroscopy (EDX) uses high kinetic energies of an electron beam. These can damage a mask. On the other hand, an analysis of a particle directly on the mask would lead to a large background in the EDX spectrum on account of the immediate surroundings of the particle, which would lead to great falsification of the analysis of the particle by the surrounding mask.

In some embodiments, an advantage of the methods described in this application is that the removed particle is not disposed of within the scope of a cleaning process and hence is no longer available for an analysis of its constituent parts. By contrast, the above-defined methods allow the particle removed from the mask to be analyzed, without the analysis result being able to be influenced by the mask and without the mask being able to be damaged by the analysis process for the particle.

From the analysis result relating to the particle, it is often possible to deduce the source that generates the particles, or it is at least possible to restrict the particle-supplying sources coming into question. Consequently, the methods according to the invention are not only repair methods for a photomask but can help in removing the creation of particles and can consequently contribute to avoiding the generation of contaminated or defective masks.

The analysis of the material of the particle to be removed can comprise the use of at least one of the following measuring techniques: energy-dispersive x-ray spectroscopy, energy-dispersive x-ray beam absorption, wavelength-selective x-ray spectroscopy, secondary ion mass spectroscopy, secondary neutral particle mass spectroscopy, Rutherford backscattering spectrometry, low-energy ion scattering spectroscopy.

In the context of the methods described here, use can advantageously be made of analysis methods that use an electron beam for exciting a sample, i.e., a particle removed from a mask. Typically, an electron beam for depositing a sacrificial tip and/or for depositing the connecting material on the particle and/or the manipulator is already available.

The sacrificial tip of the manipulator can be used for removing up to three, preferably up to 5, more preferably up to eight and most preferably up to twelve particles. The opening of the manipulator can be adapted to a size of a particle. The opening of the manipulator can be used for removing up to 10, preferably up to 20, more preferably up to 40 and most preferably up to 100 particles.

The implementation of a particle-beam-induced etching process can comprise the provision of at least one etching gas in the region of the connecting material. An etching gas can comprise water vapor ($H_2O$). An etching gas can comprise a halogen-containing gas, such as chlorine ($Cl_2$), for instance. An etching gas can comprise an oxygen-containing gas, for example $NO_2$ (nitrogen dioxide). An etching gas can comprise xenon difluoride ($XeF_2$), xenon dichloride ($XeCl_2$), xenon tetrachloride ($XeCl_4$), XNO, $XNO_2$, $XONO_2$, $X_2O$, $XO_2$, $X_2O_2$, $X_2O_4$ and $X_2O_6$, where X is a halogen, and nitrosyl chloride (NOCl).

The implementation of a particle-beam-induced etching process can comprise the provision of at least one additional gas in the region of the connecting material. The additional gas can comprise an oxidation means. The oxidation means can comprise at least one element from the group: oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$) and nitric acid ($HNO_3$).

In the second embodiment, the separation of the removed particle from the manipulator can comprise the implementation of a cleaning process. The cleaning process can comprise a wet-chemical cleaning process. This exemplary embodiment is disadvantageous in that the manipulator that is loaded with a particle is typically uninstalled from its apparatus for the cleaning process.

The method according to the invention can further include the step of: depositing an auxiliary structure on the particle.

Particles can be localized at points on a mask at which it is difficult to connect the particle to the manipulator or the sacrificial tip thereof. The deposition of an auxiliary structure on the particle makes the modified particle accessible to a method for removing a particle, as described in this application.

The deposition of the auxiliary structure can be implemented by use of a particle-beam-induced deposition process. The particle-beam-induced deposition process can comprise the provision of a precursor gas in the region of the particle. The precursor gases listed above in the context of depositing the sacrificial tip and depositing the connecting material can be used as precursor gases for depositing the auxiliary structure.

Depositing the auxiliary structure can further include the step of: thinning the auxiliary structure prior to connecting the manipulator with the auxiliary structure. Thinning the auxiliary structure can comprise implementation of a particle-beam-induced etching process. The above-described particle beams and/or etching gases can be used for implementing a particle-beam-induced etching process for thinning of the auxiliary structure.

The methods according to the invention can further include the step of: compensating electrostatic charging during the deposition of the connecting material using a charging compensation system.

The method according to the invention of the first embodiment further can include the step of: compensating electrostatic charging during the deposition of the sacrificial layer using the charging compensation system.

Compensating the electrostatic charging of the manipulator, of the photomask and/or of the particle can substantially prevent the charged particle beam from being deflected incorrectly, as a result of which the spatial resolution of a charged particle beam is reduced during a deposition process.

Positioning the manipulator in respect of the particle can further comprise the determination of a force that acts between the manipulator or the sacrificial tip of the manipulator and the particle.

By virtue of measuring the interaction between the manipulator or the sacrificial tip of the manipulator and the particle, it is possible to avoid damage to the manipulator or the sacrificial tip thereof, to the particle and/or to the photolithographic mask when the manipulator approaches the particle for the purposes of positioning the manipulator in the vicinity of the particle to be removed.

The positioning of the manipulator can comprise implementation of a relative movement between the manipulator and the particle by moving the manipulator, by moving the photolithographic mask or by carrying out a combined movement of the manipulator and the photolithographic mask.

The manipulator can comprise a cantilever. At one end, the cantilever can comprise a holding plate for fastening the cantilever to a scanning probe microscope. The sacrificial tip can be deposited on the end of the cantilever lying opposite the holding plate. The cantilever can comprise a measuring tip for examining the photolithographic mask, on which the sacrificial tip is deposited. The cantilever can have an opening at the end of the cantilever lying opposite the holding plate.

In addition to the cantilever, the manipulator can comprise an optical light-pointer system. The deflection of the cantilever, and hence a force acting between the manipulator or the sacrificial tip of the manipulator and the particle, can be determined with the aid of the optical light-pointer system.

In a first embodiment, the apparatus for removing a particle from a photolithographic mask comprises: (a) a manipulator, which is movable relative to the mask and which is movable into the vicinity of the particle to be removed; (b) a deposition apparatus, which is embodied to deposit a connecting material on the manipulator and/or on the particle from the vapor phase in order to connect the manipulator to the particle; and (c) a separating apparatus, which is embodied to separate the removed particle from the manipulator by carrying out a particle-beam-induced etching process which removes at least a portion of the manipulator.

The manipulator can comprise a sacrificial tip and/or the particle-beam-induced etching process can remove at least one portion of the sacrificial tip of the manipulator.

The apparatus can comprise a modified scanning particle microscope and/or at least one scanning probe microscope. The apparatus can comprise a modified scanning particle microscope and/or a manipulator apparatus. The manipulator apparatus can comprise a receptacle for manipulator, a positioning system and a control unit.

The modified scanning particle microscope or the modified scanning particle beam microscope can comprise at least one element of the following group: a modified scanning electron microscope, a modified scanning ion microscope, and a modified optical microscope. A scanning probe microscope can comprise at least one element of the following group: an atomic force microscope, a magnetic force microscope, a scanning near-field acoustic microscope and a near-field scanning optical microscope.

The apparatus can comprise a modified scanning electron microscope and at least one atomic force microscope. The apparatus can comprise a modified scanning electron microscope and at least one manipulator apparatus.

The manipulator can be coupled to the scanning probe microscope. The manipulator can be coupled to the manipulator apparatus. The manipulator can comprise a cantilever. At one end, the cantilever can comprise a holding plate for fastening the cantilever to the scanning probe microscope. A sacrificial tip of the manipulator can be deposited on the end of the cantilever lying opposite the holding plate. The cantilever can comprise a measuring tip, on which the sacrificial tip is deposited.

The manipulator can comprise a probe arrangement. The probe arrangement can comprise a one-dimensional probe arrangement or a two-dimensional probe arrangement. The probe arrangement can comprise at least two cantilevers. A first cantilever can comprise a measuring tip for examining the photolithographic mask. At least one second cantilever can comprise a sacrificial tip and/or an opening, for connection with the particle. The at least one second cantilever can comprise a plurality of cantilevers, for connection with one particle to be removed in each case. Each cantilever of the probe arrangement can be controlled or regulated individually by a control device of the apparatus. However, it is also possible for a probe arrangement to comprise probes with sacrificial tips that are used both as measuring tips for analyzing a sample, i.e., an element for photolithography, and for removing particles.

The apparatus of the first embodiment can be embodied to tilt the manipulator against the normal direction of the photolithographic mask.

Tilting the sacrificial tip of the manipulator against the normal direction of the photolithographic mask prevents the manipulator from shadowing, in full or in part, the particle beam inducing the deposition and, as a result, simplifies the provision of a particle beam in the region of the particle for depositing the connecting material.

The manipulator and/or the measuring tip of the manipulator can have an incline such that a particle beam incident substantially in the normal direction of the photolithographic mask can image the tip of the measuring tip and/or the tip of the sacrificial tip.

Angling the manipulator and possibly the measuring tip thereof prevents a tilting of the manipulator or the measuring tip thereof and/or of the particle beam against the normal direction of the photolithographic mask.

The apparatus can comprise one or more displacement elements, which are embodied to carry out a relative movement between the manipulator and the photolithographic mask in three spatial directions.

The deposition apparatus can further be embodied to deposit a sacrificial tip on the manipulator. In this exemplary embodiment, the apparatus can also be used for the deposition of a sacrificial tip on the manipulator or on the measuring tip of the manipulator in addition to the removal of the particle from the photomask. By virtue of the apparatus itself being able to replace a used measuring tip in the apparatus, it is possible to increase the period of time between a replacement of the manipulator. As a result, the downtime of the apparatus can be reduced.

In a second embodiment, the apparatus for removing a particle from a photolithographic mask comprises: (a) a manipulator, which is movable relative to the mask and which is movable into the vicinity of the particle to be removed; (b) and a deposition apparatus, which is embodied to deposit a connecting material on the manipulator and/or on the particle from the vapor phase in order to connect the manipulator to the particle, wherein the deposition apparatus is further embodied to provide through the manipulator a particle beam that induces the deposition.

The apparatus of the second embodiment can comprise a separating apparatus, which is embodied to separate the removed particle from the manipulator.

The apparatus can comprise a detector for detecting x-ray radiation.

In combination with a particle beam that excites the particle removed from the photolithographic mask, the detector can be used for determining a material composition of the particle. By way of example, an electron beam can be used to excite the particle. In detail, an electron beam can be directed onto the particle in order to produce characteristic x-ray radiation of the particle.

The separating apparatus can be embodied to provide at least one etching gas and at least one particle beam in the region of the connecting material.

The apparatus can comprise a gas storage system for storing one or more precursor gases, one or more etching gases and an additive or additional gas. Further, the apparatus can comprise at least one gas supply system and/or one gas metering system.

The photolithographic mask can comprise a pattern-bearing element of a photolithographic exposure process. The pattern-bearing element of the photolithographic exposure process can comprise at least one element of the following group: a photolithographic mask, a template for nanoimprint lithography and a wafer. The photolithographic mask can comprise a reflecting or transmitting mask.

The apparatuses of the first and/or second embodiment can comprise a cartridge with a supply of manipulators. Further, the apparatuses of the first and the second embodiment can comprise a container for used or consumed manipulators. The apparatuses can be embodied to automatically replace the manipulators. This means that the apparatuses can deposit an unusable manipulator in the container provided to this end and can receive a new manipulator from the cartridge. These aspects are advantageous for apparatuses of the first embodiment, for example. The sacrificial tips can be used to remove a plurality of particles; however, they are shortened by etching a part of the sacrificial tip when separating the particle from the sacrificial tip and hence used up over the course of their use.

The apparatuses of the first and/or the second embodiment can comprise a control device that is embodied to carry out the method steps of the methods, according to the invention, of the first and the second embodiments explained above.

A computer program can comprise instructions which, when executed by a computer system, prompt the apparatus, according to the invention, of the first embodiment to carry out the method steps, according to the method according to the invention, of the first embodiment.

Finally, a computer program can comprise instructions which, when executed by a computer system, prompt the apparatus, according to the invention, of the second embodiment to carry out the method steps, according to the method according to the invention, of the first embodiment.

BRIEF DESCRIPTION OF DRAWINGS

The following detailed description describes currently preferred exemplary embodiments of the invention, with reference being made to the drawings, in which.

DETAILED DESCRIPTION

Currently preferred embodiments of the methods according to the invention and of apparatuses according to the invention for removing a particle from a photolithographic mask are explained in greater detail below. However, the methods according to the invention and the apparatuses according to the invention are not restricted to the examples discussed below. Instead, these can be used in general for removing particles from pattern-bearing elements, which are used in a photolithography process. In addition to photomasks, examples of these elements are templates, which are used in nano-imprint lithography, and wafers to be processed.

Figure 1:
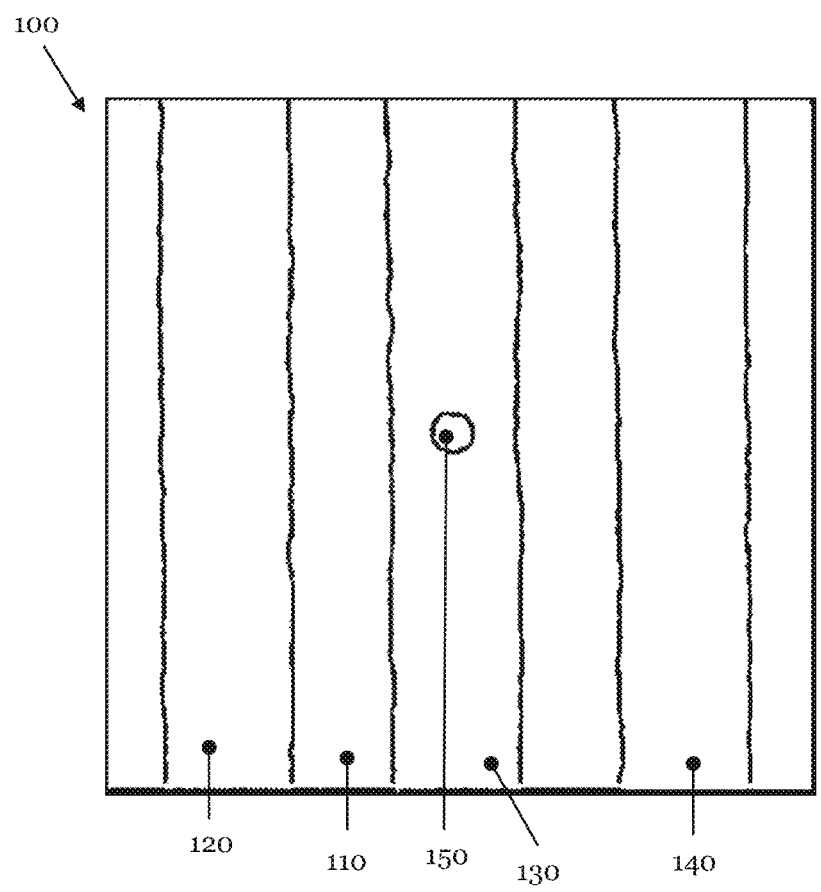
FIG. 1 schematically shows an excerpt of a plan view of a photolithographic mask, on which a particle that can be removed with the aid of a cleaning process is present.

FIG. 1 shows a plan view of an excerpt of a photolithographic mask 100. The excerpt of the photolithographic mask 100 presents a substrate 110, on which three pattern elements 120, 130, 140 of absorbing material are arranged in the form of vertical strips. On account of the localization of the particle 150 on the pattern element 130, which typically has a height of 50 nm to 200 nm, the particle 150 can be removed from the photomask 100 with the aid of a cleaning process.

Figure 2:
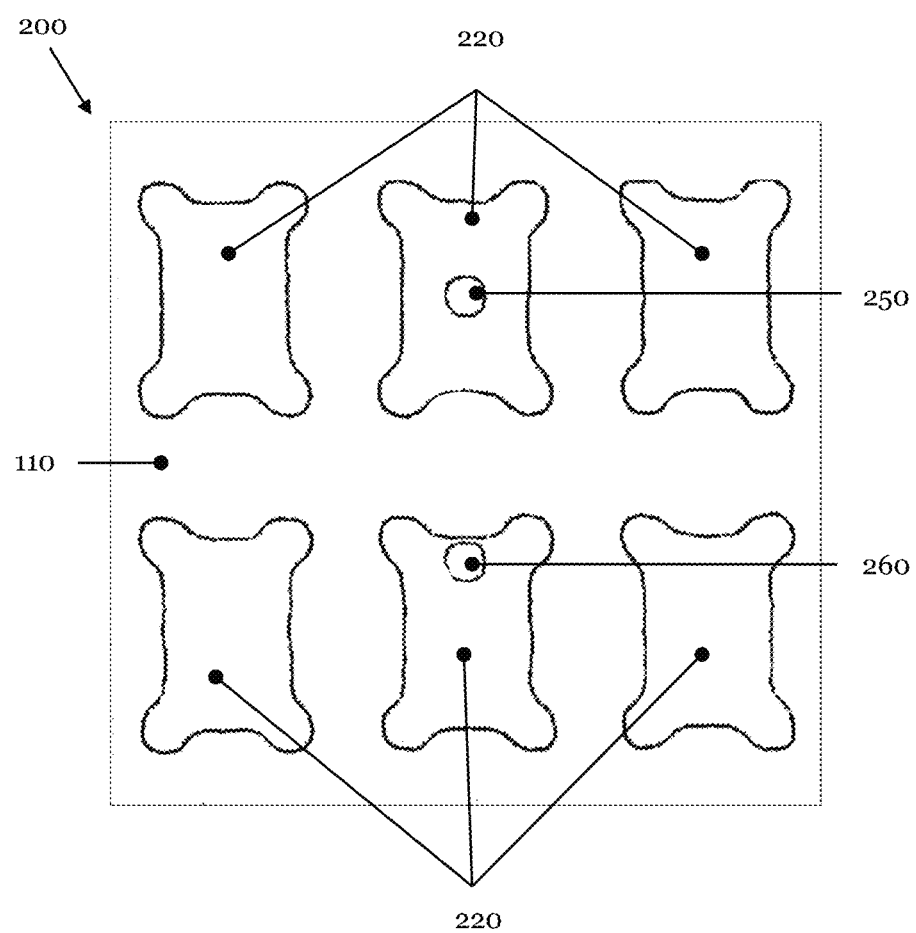
FIG. 2 schematically presents an excerpt of a plan view of a photolithographic mask, on which two particles that cannot be removed with the aid of a cleaning process are present.

FIG. 2 likewise reproduces an excerpt of a plan view of a photolithographic mask 200. The exemplary mask 200 has a substrate 110. Two rows with a total of six contact holes 220 are introduced into the substrate 110 of the mask 200. A particle 250 is present in a substantially central position in the central contact hole 220 of the upper row. In the lower row, a particle 260 is localized at the upper edge of the central contact hole 220. Typically, a contact hole 220 has a depth in the range of 50 nm to 200 nm. Neither particle 250 and 260 can be removed from the mask 200 by use of a cleaning process. In addition to the particles 250, 260 that are present in a depression of a photomask, it is not possible to remove, or only possible to remove with great difficulties, particles that are adsorbed at the edge of a pattern element 120, 130, 140 and, for example, in corners of a pattern element from the mask 100, 200 with the aid of a cleaning process. The following description of the removal of particles from photomasks relates to particles 250, 260 that cannot be removed from a photomask 200 by use of a cleaning process.

Figure 3:
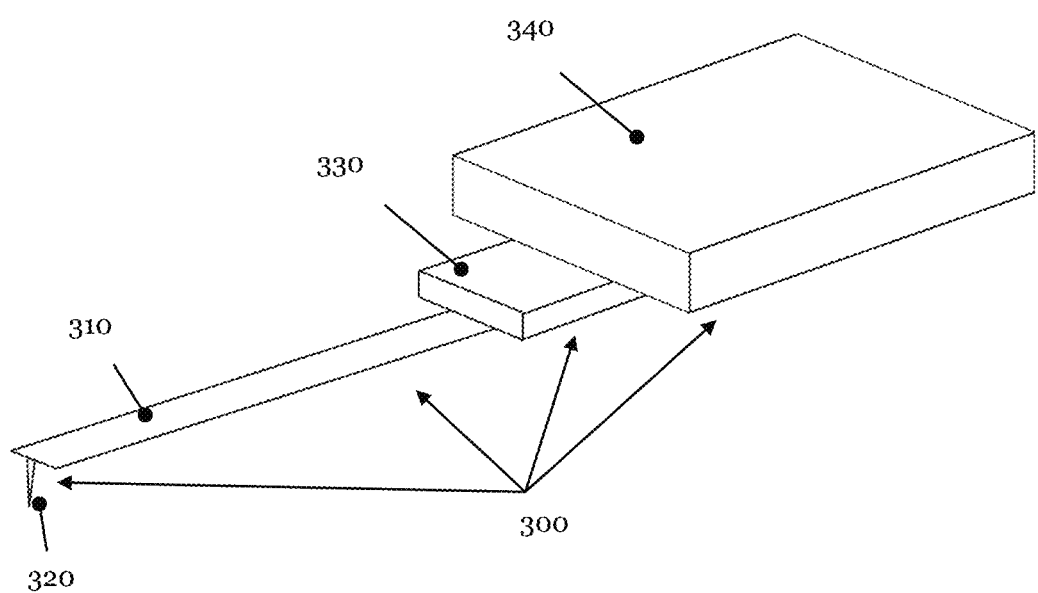
FIG. 3 schematically reproduces an example of a manipulator in the form of a cantilever, a measuring tip, a holding plate and a receptacle of a manipulator apparatus or of a scanning probe microscope.

FIG. 3 schematically illustrates a manipulator 300. The exemplary manipulator comprises a bending beam 310, a sprung beam 310 or a lever arm 310. The bending beam 310 hereinafter—as customary in the technical field—is referred to as cantilever 310. The cantilever 310 of the manipulator 300 has a measuring tip 320 at one end (the free end). In the example of the FIG. 3, the measuring tip 320 comprises an elongated thin tip having a small radius of curvature, which tip is suitable for analyzing a sample surface such as, for instance, the mask 100, 200. (The expressions sample and photomask are used as synonyms hereinafter.) At the end lying opposite the measuring tip 320 or the free end, the cantilever 310 of the manipulator 300 has a fastening region 330, which is also referred to as holding plate 330 or holding element 330 below. Further, the manipulator 300 comprises a carrier element 340. The sprung beam 310 and the holding element 330 are often manufactured from a piece of monocrystalline silicon. Typically, the carrier element 340 is adhesively bonded to the holding plate 330 of the manipulator 300. The carrier element 340 renders it possible to install the manipulator 300 in a measuring head of a scanning probe microscope or a head of a manipulator apparatus (not illustrated in FIG. 3).

The cantilever 310 of the manipulator 300 can be moved by a measuring head of a scanning probe microscope or the head of a manipulator apparatus by way of a movement of the receptacle 340. For example, the cantilever 310 can be excited to vibrate. To this end, the carrier element 340 of the manipulator 300 can be connected to a piezo-element that can excite the cantilever 310 to oscillate, for example at the resonant frequency of the manipulator 300 (likewise not reproduced in FIG. 3). Further, it is possible to excite the manipulator 300 or the cantilever 310 thereof to oscillate with the aid of a laser beam. An oscillating mode of the cantilever 310 can be used during the approach of the measuring tip 320 to the surface of the photomask 200 and/or for scanning the mask 200 in the region of the particle 250, 260.

The cantilever 310 can have a biomorphic structure, i.e., comprise two interconnected layers lying above one another, said layers exhibiting different thermal expansion properties (not illustrated in FIG. 3). Depending on the embodiment, the cantilever 310 can be bent towards or away from the sample surface as a result of depositing energy into said cantilever. By way of example, energy can be introduced locally into the cantilever 310 by irradiation with a laser beam or an electron beam. Further, it is possible to attach a heating resistor to the cantilever 310 in order to bend the latter toward or away from the sample surface by local heating (not shown in FIG. 3).

The cantilever 310 can comprise an actuator in the form of a piezo-actuator (not illustrated in FIG. 3). The piezo-actuator can deflect the cantilever 310. For example, the piezo-actuator can bend the measuring tip 320 in the direction of a sample surface. Furthermore, the piezo-actuator can excite the cantilever 310 of the manipulator 300 to oscillate. Preferably, a piezo-actuator excites the cantilever 310 at or close to a resonant frequency of the manipulator 300. In a preferred alternative embodiment, a piezo-actuator is attached in the region of the carrier element 340 and said piezo-actuator connects the manipulator 300 to a measuring head of a scanning probe microscope or a head of a manipulator apparatus. In the embodiment mentioned last, the cantilever 310 can comprise a resistive element that can be used for bending the cantilever 310 towards or away from the surface of the mask. The above-described with a piezo-actuator integrated in the sprung beam 310 uses the inverse piezoelectric effect.

Further, it is possible to deflect the cantilever 310 on account of electrostatic forces and/or on the basis of the inverse piezoelectric effect. Moreover, magnetic fields (magnetostriction) can be used to move the cantilever 310 towards the sample surface or away from the sample surface. Scanning particle microscopes, e.g., scanning electron microscopes, can have a high sensitivity to electric and magnetic fields.

That surface of the cantilever 310 of the manipulator 300 which is situated opposite the measuring tip 320 can be provided with a thin metallic reflection layer in order to increase the reflectivity of the surface of the cantilever 310 for a light beam that functions as a light pointer (not shown in FIG. 3). The approach of the manipulator to the photomask 200 can be tracked indirectly with the aid of the light-pointer system by way of an interaction of the measuring tip 310 with a sample surface. Moreover, the light-pointer system can be used during the operation of the manipulator 300 for determining the interaction between the measuring tip 320 and the photomask 200, or between the measuring tip 320 and the particle 250, 260.

Figure 4:
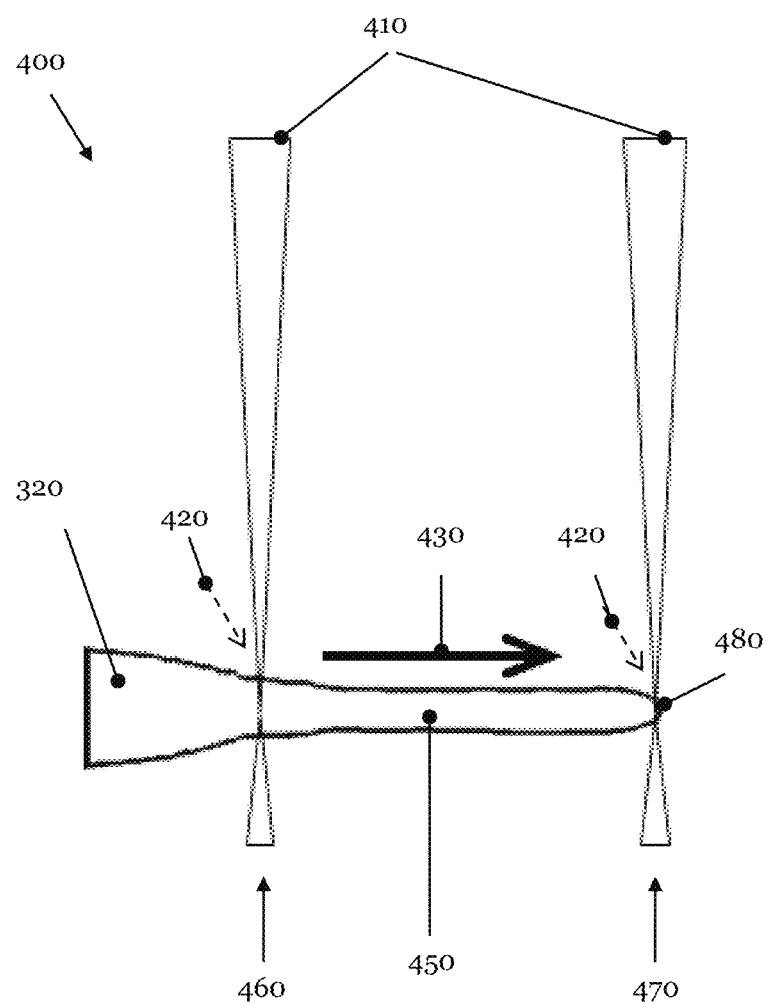
FIG. 4 schematically presents a deposition process of a sacrificial tip on the measuring tip of the manipulator of FIG. 3.

A first exemplary embodiment of the removal of a particle from a photomask is explained in subsequent FIGS. 4 to 10. The process starts in diagram 400 of FIG. 4 with the deposition of a sacrificial tip 450 on the measuring tip 320 of the manipulator 300. In the example illustrated in FIG. 4, the deposition is carried out with the aid of a particle-beam-induced deposition process. In FIG. 4, the measuring tip 320 is perpendicular to the particle beam 410, which is embodied as an electron beam 410 in the diagram 400. To this end, it is useful either to turn the measuring tip 320 of the manipulator 300 through 90° or to rotate the electron beam 410 through 90°. It is also possible that the electron beam 410 and the manipulator 300 carry out a combined movement such that the measuring tip 320 of the manipulator 300 is substantially perpendicular to the axis of the electron beam 410. In the example of FIG. 4, the measuring tip 320 is rotated through 90° in relation to its usual operating direction. The electron beam 410 is focused on the tip of the measuring tip 320. A precursor gas 420 is provided at the location of incidence of the electron beam 410 on the measuring tip 320. This is indicated by the dashed arrows 420 in FIG. 4. In the example presented in FIG. 4, the precursor gas 420 comprises styrene ($C_8H_8$). The styrene precursor gas has a high carbon content, and so the sacrificial tip 450 comprises carbon as a main constituent. Should a conductive sacrificial tip 450 be deposited, the metal carbonyl dicobalt octacarbonyl ($Co_2(CO)_6$) can be used as precursor gas 420 (not illustrated in FIG. 4).

The deposition process begins at the measuring tip 320 (symbolized by the arrow 460) and proceeds along the direction 430 indicated by arrow 430 and ends with a length of the sacrificial tip 450 that is indicated by the arrow 470. In the example illustrated in FIG. 4, a substantially cylindrical sacrificial tip 450 with a tip 480 in the form of an elliptical paraboloid of revolution is deposited. The electron beam for depositing the sacrificial tip 450 comprises an energy range from 100 eV to 50 keV; currently, preferred values lie in the region of 5 keV. The current of the flow of electrons comprises a range from 1 pA to 50 nA. Currently, currents in the region of 20 pA are frequently used.

In an alternative embodiment, the measuring tip 320 of the manipulator 300 already has a sacrificial tip 450 and the processes of depositing the sacrificial tip 450 can be avoided. Moreover, the manipulator 300 can have a used sacrificial tip before a particle removal process is carried out. In this case, either the manipulator 300 is replaced by a new manipulator 300 with a sacrificial tip 450 or the used sacrificial tip is removed from the manipulator 300, for example by carrying out a particle-beam-induced etching process, and a new sacrificial layer 450 is deposited on the measuring tip 320 of the manipulator 300, as explained above.

Figure 5:
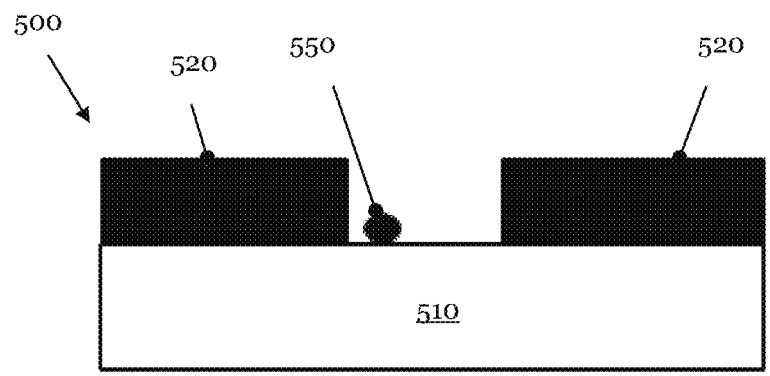
FIG. 5 reproduces a schematic section through a photolithographic mask, wherein the substrate of the photomask has a defect in the form of a particle.

FIG. 5 shows a schematic section through a photomask 500. The photolithographic mask 500 has a transmitting substrate 510 with absorbing pattern elements 520. A particle 550 is present on the substrate 510 in the vicinity of the left pattern element 520. On account of its position in the vicinity of a pattern element 520, the particle 550 cannot be removed, or can only be removed with great outlay, from the photomask 500 using a cleaning process.

As specified above, the mask 500 in FIG. 5 is a transmitting photomask. However, the methods for removing the particle 550 described below can also be applied to reflecting masks.

Figure 6:
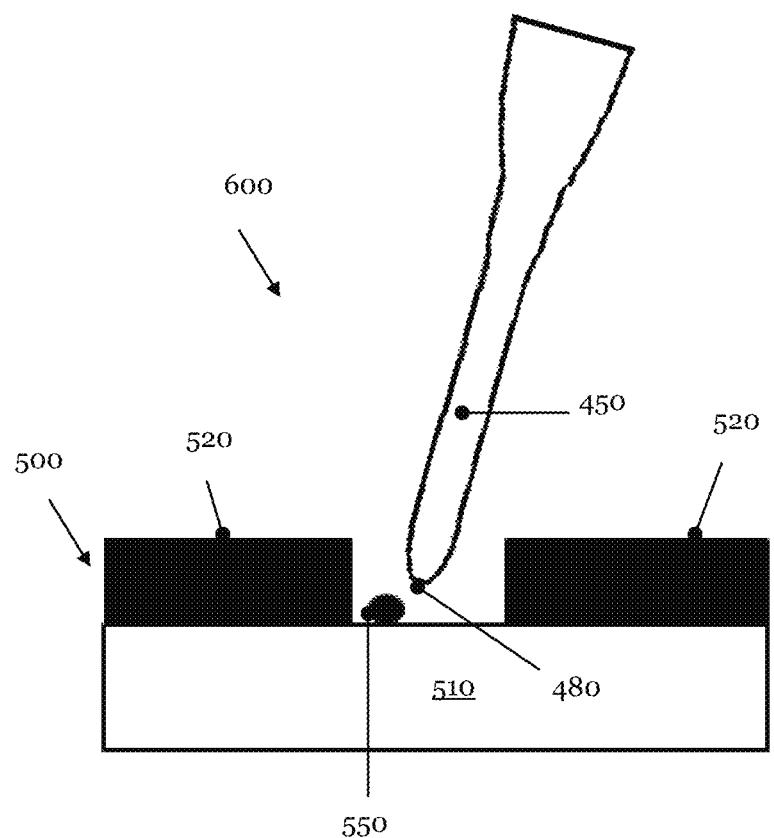
FIG. 6 elucidates the mask of FIG. 5 after the sacrificial tip of a manipulator has approached the particle of the photomask.

The diagram 600 in FIG. 6 represents the mask 500 of FIG. 5 after the tip 480 of the sacrificial tip 450 of the manipulator 300 has been positioned in the vicinity of the particle 550. In the example of FIG. 6, the distance between the particle 550 and the tip 480 of the sacrificial tip 450 is approximately 50 nm. It is currently preferred to bring the tip 480 of the sacrificial tip 450 into mechanical contact with the particle 550.

Figure 7:
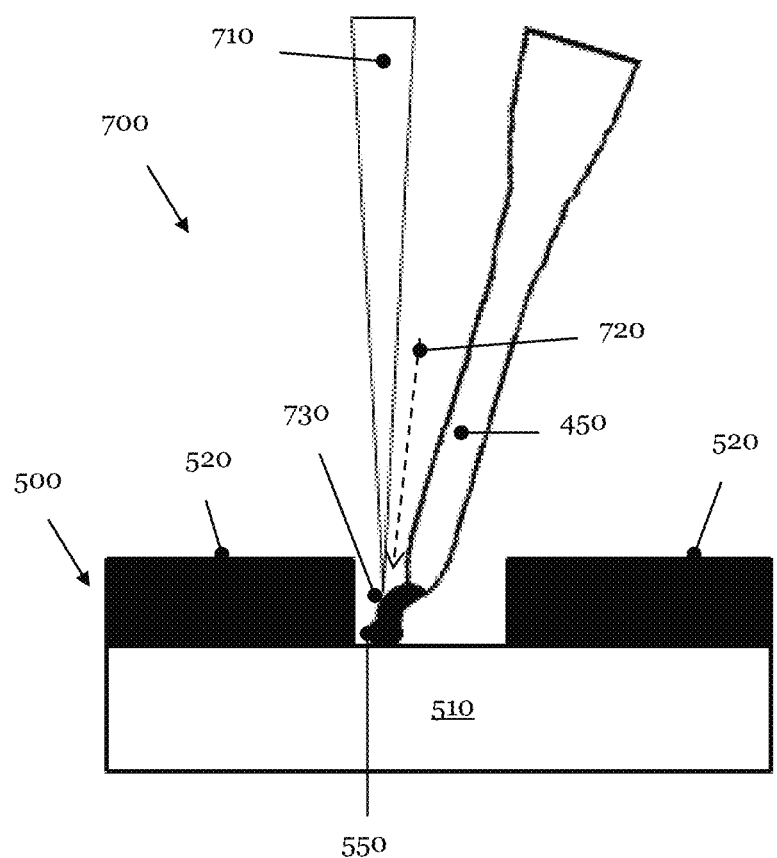
FIG. 7 illustrates the configuration of FIG. 6 during the deposition of a connecting material onto the sacrificial tip and the particle with the aid of a particle-beam-induced deposition process.

The diagram 700 in FIG. 7 shows the process of depositing connecting material 730 on the particle 550 and the sacrificial tip 450 of the manipulator 300 for the purposes of connecting the particle 550 and the sacrificial tip 450. The deposition process illustrated in FIG. 7 comprises a particle-beam-induced deposition process. To this end, an electron beam 710 is used as a particle beam 710. The kinetic energy of the electron beam 710 for depositing the connecting material 730 lies in the range from 100 eV to 50 keV; currently, an electron energy in the region of 5 keV is preferably used. The current of the beam flow comprises a range from 1 pA to 50 nA; currently, currents in the region of 20 pA are used. Further, a precursor gas 720 is provided in the region of the particle. This is elucidated by the dashed arrow. Styrene ($C_8H_8$) is used as precursor gas 720 in the exemplary deposition process for the connecting material 730 illustrated in FIG. 7. As already explained above, the styrene precursor gas has a high carbon content, and so the connecting material 730 likewise has a high carbon content.

Figure 8:
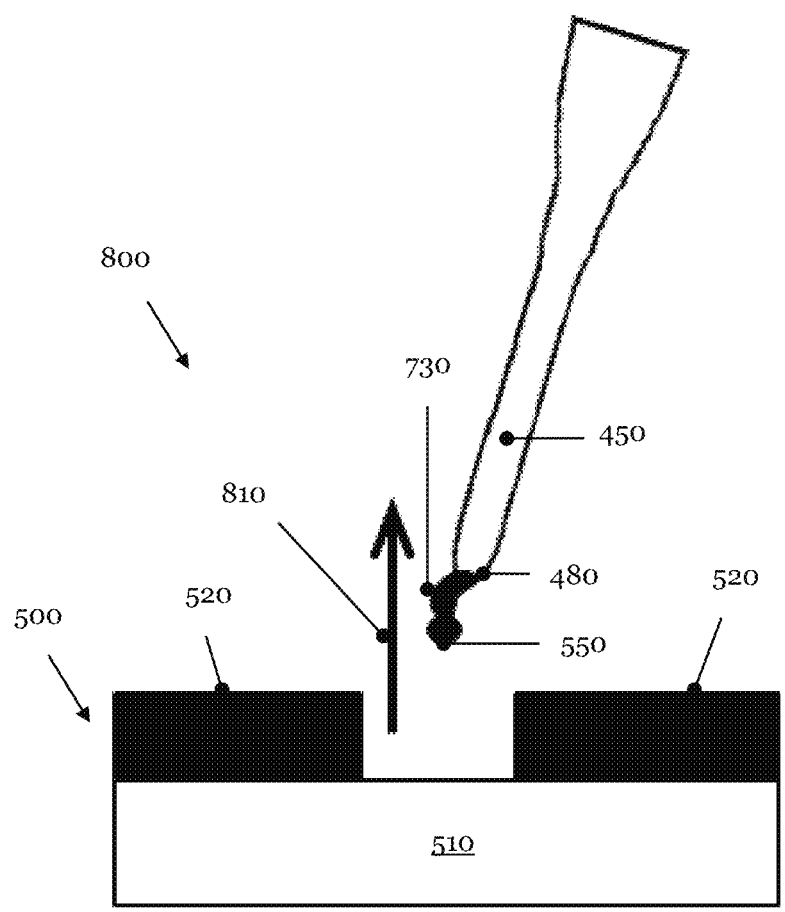
FIG. 8 schematically presents the removal of the particle connected to the sacrificial tip of the manipulator.

The diagram 800 in FIG. 8 elucidates the removal of the particle 550, which has been connected to the sacrificial tip 450, from the substrate 510 of the photomask 500. In FIG. 8, the removal of the particle 550 from the substrate 510 is symbolized by the arrow 810. In the example of FIG. 8, the manipulator 300, which carries the sacrificial tip 450, is moved away from the photomask 500 in the normal direction. Alternatively, the photomask 500, which is typically arranged on a stage, can be lowered downwards (not shown in FIG. 8). A combined movement of the sacrificial tip 450 and the photolithographic mask 500 is likewise possible.

The particle 550 that is coupled to the tip 480 of the sacrificial tip 450 can be analyzed after said particle 550 has been detached from the substrate 500. To this end, the sacrificial tip 450 is brought into a position in which the latter can be irradiated by the particle beam 710, for example, without the particle beam 410, for instance an electron beam 410, being able to damage the photomask 500 (not illustrated in FIG. 8). By way of example, the radiation emitted by the particle 550 that was excited by the electron beam 710 can be analyzed using an x-ray beam detector. The material composition of the particle 550 can be determined from the measurement data of the detector.

Figure 9A:
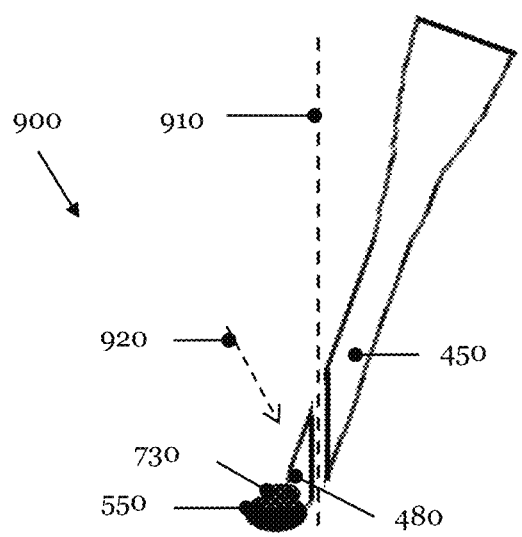
FIG. 9A schematically reproduces, in a first example, the separation of the particle from a sacrificial tip by carrying out a particle-beam-induced local etching process.

The diagram 900 in FIG. 9A schematically shows the separation of the removed particle 550 from the tip 480 of the sacrificial tip 450, which is optionally carried out after completing the analysis process for the particle 550. In the example of FIG. 9A, the separation is implemented by carrying out an electron-beam-induced etching process (EBIE, electron beam induced etching). In the example illustrated in FIG. 9A, the sacrificial tip 450—as explained in the context of FIG. 9A—has carbon as a main constituent. Water vapor as the etching gas 920 is provided in the vicinity of the tip 480 of the sacrificial tip 450. At the same time, a focused electron-beam 910 excites the etching gas 920 or splits the etching gas 920. If necessary, an additive or additional gas can be supplied to the reaction location in addition to the etching gas 920, said additive or additional gas assisting with the local etching process. By way of example, an additive gas can be oxidation means, such as oxygen ($O_2$) and/or chlorine ($Cl_2$), for instance.

Figure 9B:
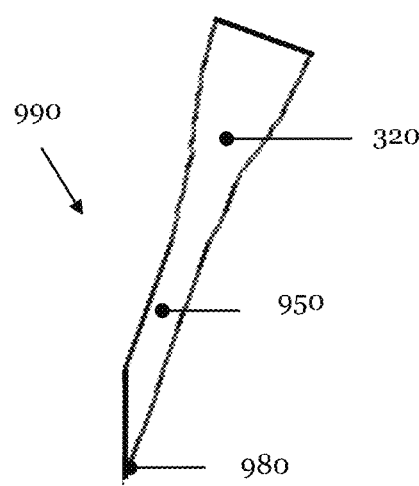
FIG. 9B reproduces the sacrificial tip of FIG. 9A after the separation of the particle.

The diagram 990 in FIG. 9B presents the modified sacrificial tip 950 after completion of the process of separation from the particle 550. The tip 980 of the modified sacrificial tip 950 has a different form to the unused sacrificial tip 450. Despite the modified tip 980, the modified sacrificial tip 950 can be used to remove further particles 550 from the photomask 500. Depending on the length and material composition of the sacrificial tip 450 and the execution of the process of separating the particle 550 connected to the sacrificial tip 450, a sacrificial tip 450 can typically be used to remove five to 10 particles 550. The sacrificial tip 450 can have one or more markings and/or constrictions, which simplify the removal of the particle 550 from the sacrificial tip 450.

If the sacrificial tip 450 has an electrically conductive embodiment, for example by virtue of a metal carbonyl being used for the production thereof, the etching gas to be employed is selected depending on the material of the sacrificial tip. By way of example, if chromium hexacarbonyl ($Cr(CO)_6$) is used as precursor gas, a mixture, for example, of xenon difluoride ($XeF_2$), water vapor and nitrosyl chloride (NOCl) can be used as an etching gas for separating a particle 550 from the sacrificial tip 450.

Figure 10:
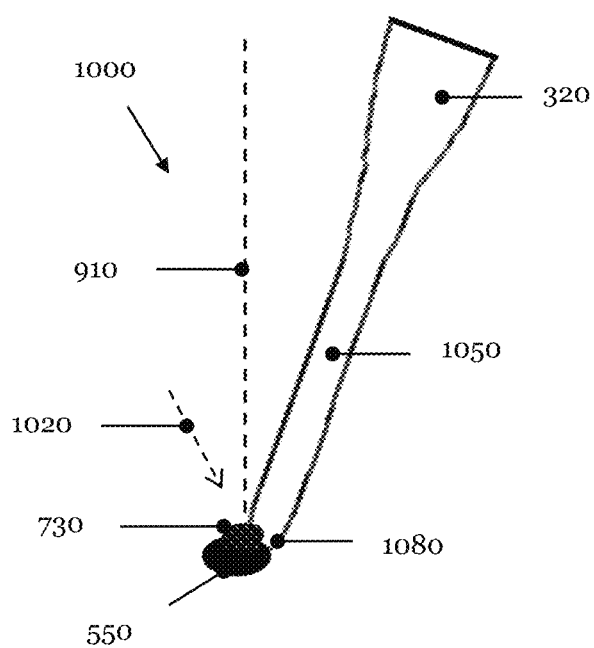
FIG. 10 schematically elucidates, in a second example, the separation of the particle from a sacrificial tip by carrying out a particle-beam-induced local etching process.

The diagram 1000 in FIG. 10 presents a sacrificial tip 1050, the material of which is not etchable, or only etchable very poorly, by, e.g., water vapor, such as, e.g., a sacrificial tip 1050 that was manufactured from quartz. If now, additionally, the connecting material 730 is easily etchable by water vapor, for example because its main constituent is carbon, an electron-beam-induced etching process can remove the particle 550 from the tip 1080 of the sacrificial tip 1050 without the tip 1080 of the sacrificial tip 1050 being substantially modified. In FIG. 10, the electron-beam-induced etching process is symbolized by the electron beam 910 and the etching gas 1020.

In an alternative embodiment, the particle 550 is directly connected to the measuring tip 320 of the manipulator 300, without a sacrificial layer 450 being deposited on the measuring tip 320. As described in the preceding paragraph, the particle 550 is separated from the measuring tip of the manipulator by use of an EBIE (electron beam induced etching) process. This embodiment is advantageous in that the deposition of a sacrificial tip 450 is avoided.

Figure 11:
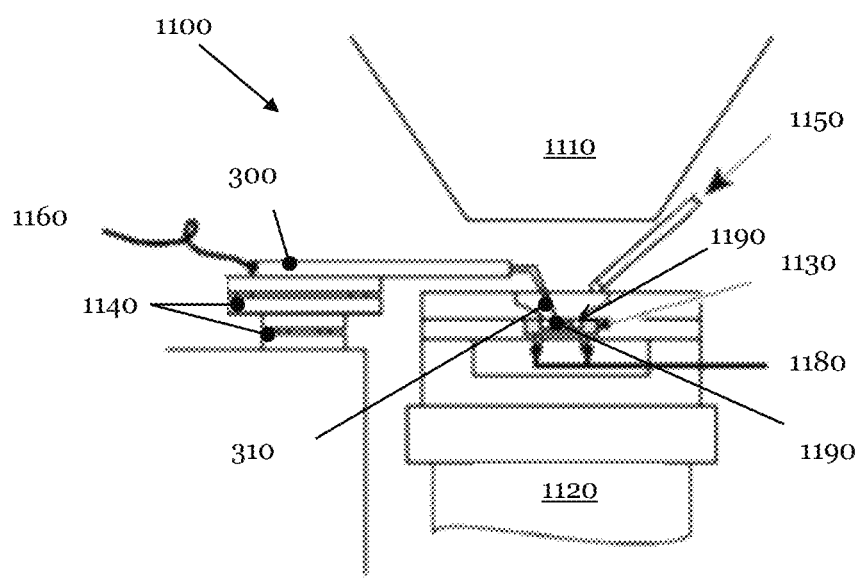
FIG. 11 shows a schematic section through an apparatus for depositing a sacrificial tip by field emission.

FIG. 11 shows a schematic section through an apparatus 1100 for depositing a sacrificial tip 450 on the measuring tip 320 of a manipulator 300 by use of field emission. The apparatus 1100 represents an alternative to the particle-beam-induced deposition process for a sacrificial tip 450 explained in the context of FIG. 4. The manipulator 300 with measuring tip 320 is arranged on piezo-actuators 1140. These facilitate the positioning of the measuring tip 320 over the electrode 1190, which within a housing 1130 that is arranged electrically isolated from the surroundings. The electrode 1190 is arranged on a stage 1120 of a scanning electron microscope 1110. The scanning electron microscope 1110 serves, firstly, to align the measuring tip 320 on the electrode 1190 and, secondly, to image the deposited sacrificial tip. In detail, reference sign 1110 denotes both the scanning electron microscope 1110 and the output lens element 1110 of the scanning electron microscope 1110. A precursor gas is provided between the measuring tip 320 and the electrode 1190 by way of the gas inlet 1150. By way of example, one of the aforementioned metal carbonyls can be used as precursor gas.

Figure 12:
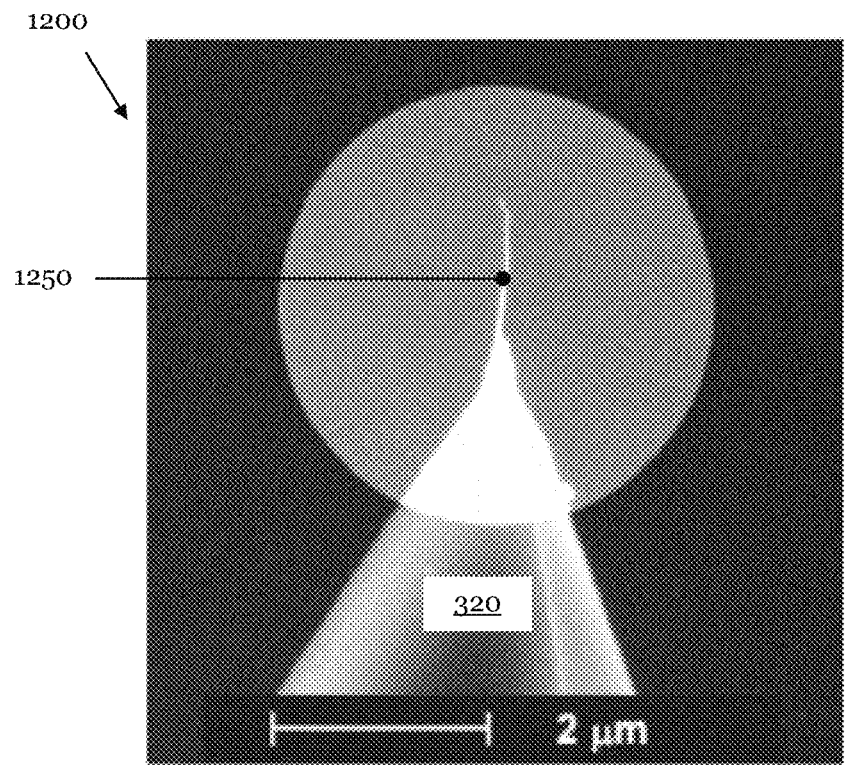
FIG. 12 illustrates a sacrificial tip deposited on a measuring tip by field emission.

An electric field 1190 is produced between the measuring tip 320 of the manipulator 300 and the electrode by way of the electrical connectors 1160 and 1180. The electric field has the greatest field strength (>$10^9$ V/m) at the tip of the measuring tip 320. A flow of electrons with a high local density occurs in this region as a result of field emission, said electron flow sufficing to excite the precursor gas 1150 such that a sacrificial tip 1250 is deposited on the measuring tip 320 of the manipulator 300. The diagram 1200 in FIG. 12 reproduces a recording by the scanning electron microscope 1110 of the sacrificial tip 1250 on the measuring tip 320. The sacrificial tip 1250 grows substantially in the direction of the gradient of the electric field.

Figure 13:
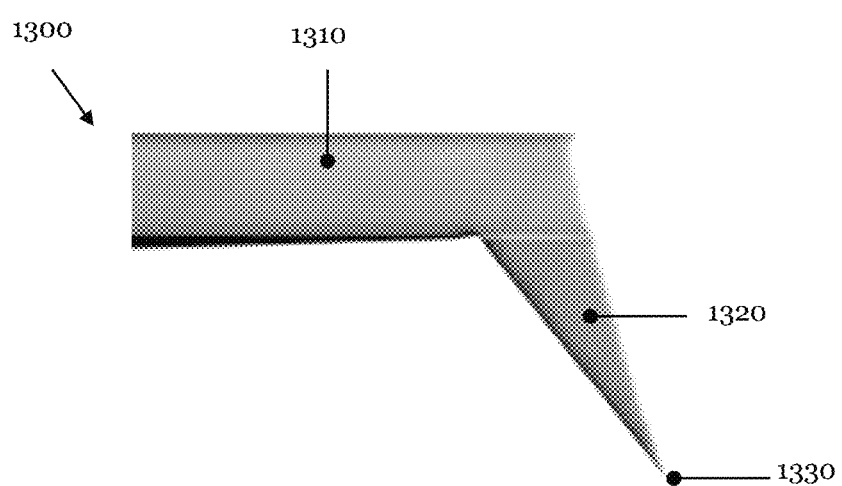
FIG. 13 presents a schematic section through a cantilever with a measuring tip, with the cantilever and the measuring tip being angled.

As elucidated in FIG. 7, the sacrificial tip 450 in the first exemplary embodiment explained above is tilted against the normal direction or direction of incidence of the particle beam 710 so that the particle beam 710 is not shadowed when depositing the connecting material 730 between the particle 550 and the tip 480 of the sacrificial tip 450. As the second example, FIG. 13 illustrates a manipulator 1300 that need not be inclined or tilted against the direction of incidence of the particle beam 710 for the purposes of removing the particle 550. The cantilever 1310 and the measuring tip 1320 of the manipulator 1300 are angled in such a way that a particle beam 710 can image the tip 1330 of the measuring tip 1320 in the case of a horizontal cantilever 1310. The beam direction of the particle beam 710 and the alignment of a sacrificial tip 450, 1250 can also be substantially parallel to one another after the deposition of a sacrificial tip 450, 1250 on the tip 1330 of the measuring tip 1320 if the sacrificial tip 450 has a similarly angled arrangement as the measuring tip 1320.

Figure 14:
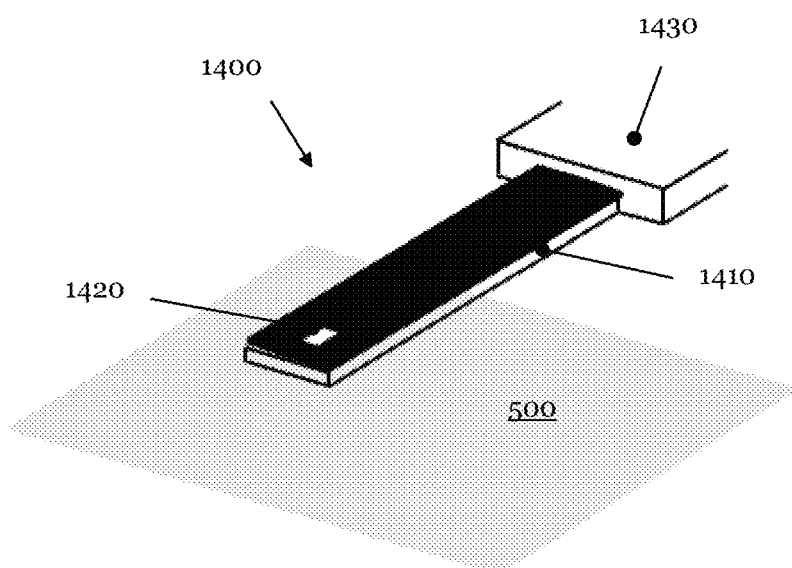
FIG. 14 reproduces a second example of a manipulator, the cantilever of the manipulator having an opening on the side distant from the holding plate.

Now, a second exemplary embodiment for removing a particle 550 from a photomask 500 is presented on the basis of FIGS. 14 to 17. As a third example, FIG. 14 schematically shows a manipulator 1400, which comprises a cantilever 1410 and a holding plate 1430. The carrier elements of the manipulator 1400 are suppressed in FIG. 14. This also applies to the further subsequent manipulators. Instead of a measuring tip 320, 1320, the cantilever 1410 has an opening 1420 at its free end, i.e., the end lying opposite the holding plate 1430. The opening 1420 can have any form. In the example illustrated in FIG. 14, the opening 1420 is square with a side length of approximately 50 nm. The manipulator 1400 is arranged over the photomask 500 which contains the particle 550, the latter not being illustrated in FIG. 14.

Figure 15:
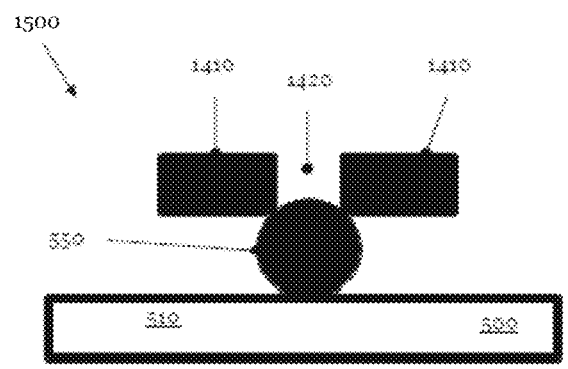
FIG. 15 illustrates a schematic section through a photomask in the region of a particle, with the opening of the manipulator of FIG. 14 being positioned over the particle.

FIG. 15 schematically shows a section through the substrate 510 of the photolithographic mask 500 in the region of the particle 550. The opening 1420 of the cantilever 1400 is positioned over the particle 550. In the example illustrated in FIG. 15, the edges of the opening 1420 are at least partly in contact with the particle 550. However, it is also possible for the edges of the opening 1420 to have a distance from the particle 550 up into the three-digit nanometer range. More connecting material has to be deposited for connecting the manipulator 1400 to the particle 550 as the distance of the edges of the opening 1420 from the particle 550 increases. The particle removal process starts to become uneconomical above a distance of approximately 1 μm.

Figure 16:
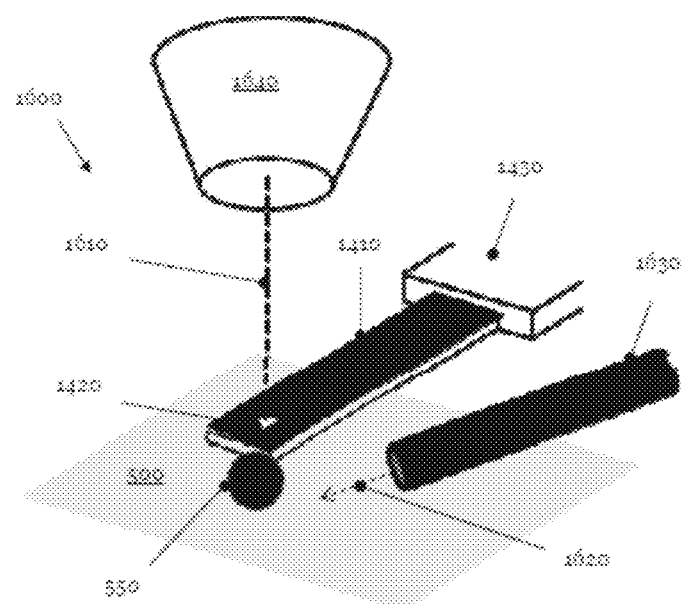
FIG. 16 schematically presents an arrangement for depositing connecting material on the edges of the opening of the manipulator and the particle of FIG. 15.

FIG. 16 schematically shows the cantilever 1410 being connected to the particle 550 by depositing connecting material with the aid of a particle-beam-induced deposition process. To this end, a gas supply system 1630 provides a precursor gas 1620 in the region of the particle 550. A particle beam 1610, which is an electron beam 1610 of a scanning electron microscope 1640 in the example of FIG. 16, excites the precursor gas 1620 such that the latter deposits the connecting material.

Figure 17:
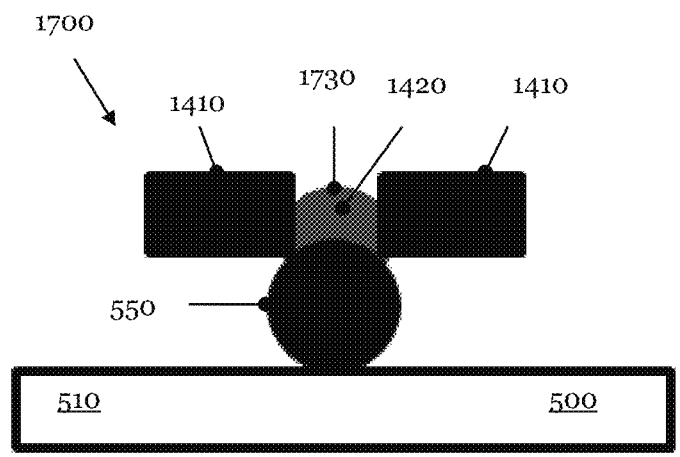
FIG. 17 shows FIG. 14 with deposited connecting material and illustrates the lifting of the particle of FIG. 15 by moving the manipulator of FIG. 14 and/or the photolithographic mask of FIG. 15.
Figure 17:
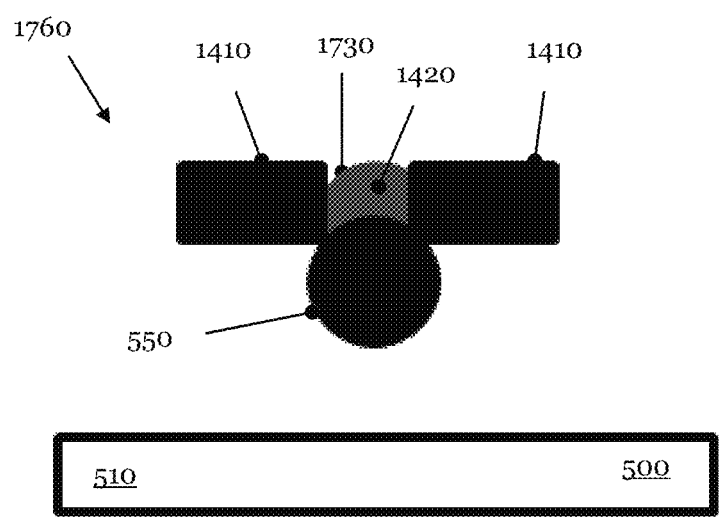

The diagram 1700 in FIG. 17 reproduces FIG. 15 after the connecting material 1750 was deposited on the particle 550 and on the edges of the opening 1420 of the cantilever 1410 of the manipulator 1400. The diagram 1760 in FIG. 17 presents a configuration after the particle 550 was removed from the substrate 510 of the mask 500 by a relative movement between the manipulator 1400 and the mask 500.

Figure 18:
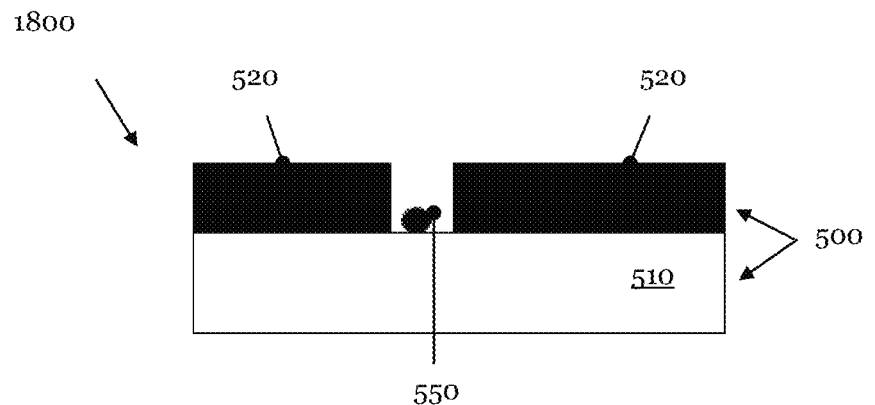
FIG. 18 reproduces a particle that is localized in a gap between two pattern elements of a photomask and schematically illustrates the deposition of an auxiliary structure on the particle of the diagram 1800 in FIG. 18.
Figure 18:
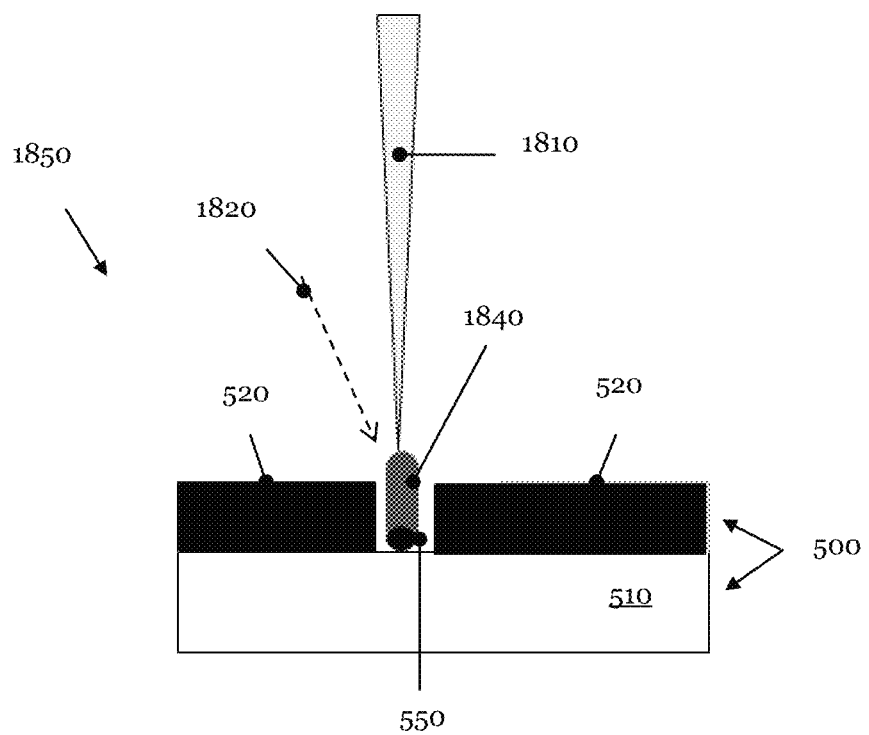
Figure 19:
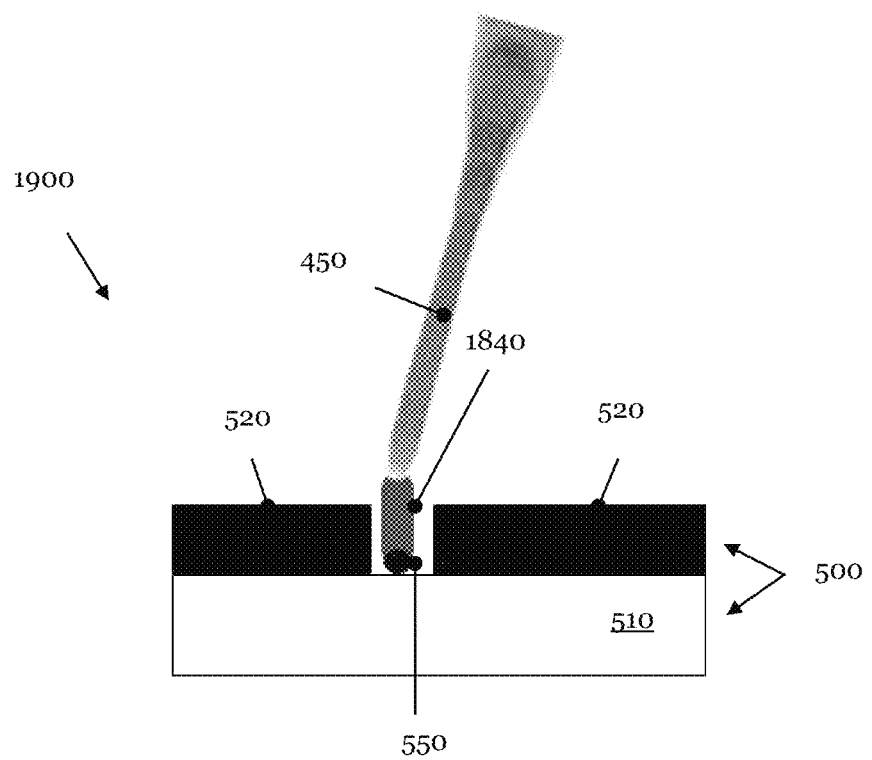
FIG. 19 reproduces the lower part of FIG. 18 (diagram 1850), wherein a sacrificial tip is positioned in the vicinity of the auxiliary structure deposited on the particle.

FIGS. 18 and 19 explain a modification of the first exemplary embodiment in the case where the particle 550 is localized at a position which cannot be approached, or at least cannot be approached without risks, by the measuring tip 320, 1320 or the sacrificial tip 450 of the manipulator 300. The diagram 1800 in FIG. 18 presents a photomask 500, the pattern elements 520 of which only leave a narrow gap free with a small expanse to the substrate 510 of the mask 500. A small particle 550 is present on the substrate 510 in this gap. The introduction of the sacrificial tip 450 into the gap for the purposes of positioning the sacrificial tip 450 in the vicinity of the particle 550 could lead to one or more of the pattern elements 520 and/or the sacrificial tip itself being damaged.

The diagram 1850 in FIG. 18 schematically presents the solution to this problem. An auxiliary structure 1840 is deposited on the particle 550 by use of a particle-beam-induced deposition process such that the particle 550 including the auxiliary structure 1840 deposited thereon for the pattern elements 520 is protruding. In the example illustrated in the diagram 1850, a precursor gas 1820, symbolized by the arrow in the vicinity of the particle 550, is provided for the purposes of depositing the auxiliary structure 1840 on the particle 550. If an electrically conductive connection is intended to be established between the particle 550 and the sacrificial tip 450, a metal carbonyl, for instance dicobalt octacarbonyl ($Co_2(CO)_6$), can be used for the precursor gas 1820. If no electrically conductive connection is required between the particle 550 and the sacrificial tip 450, use can be made of a carbon-containing precursor gas 1820, such as styrene, for instance.

The diagram 1900 in FIG. 19 demonstrates that the sacrificial tip 450, 1250 can be brought into the vicinity of the auxiliary structure 1840 or placed on the latter without risks. As already discussed in the context of FIG. 7, connecting material 730 can be deposited on the auxiliary structure 1840 and/or the sacrificial tip 450, 1250 in the next step (not shown in FIG. 19). Thereupon, the particle 550 is lifted out of the gap in the mask 500 by way of a relative movement between the photomask 500 and the sacrificial tip 450, 1250 (not illustrated in FIG. 19).

Figure 20:
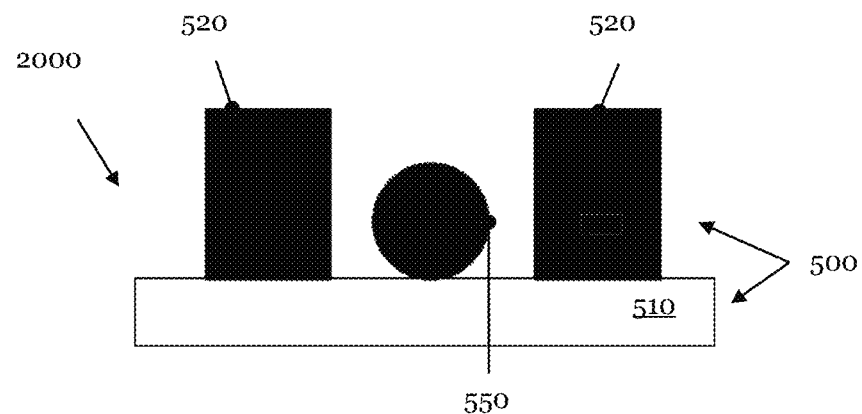
FIG. 20 shows a small particle arranged between two line-shaped pattern elements in the upper partial image (diagram 2000) and illustrates a second example of an auxiliary structure that was deposited on the particle in the lower partial image (diagram 2050)
Figure 20:
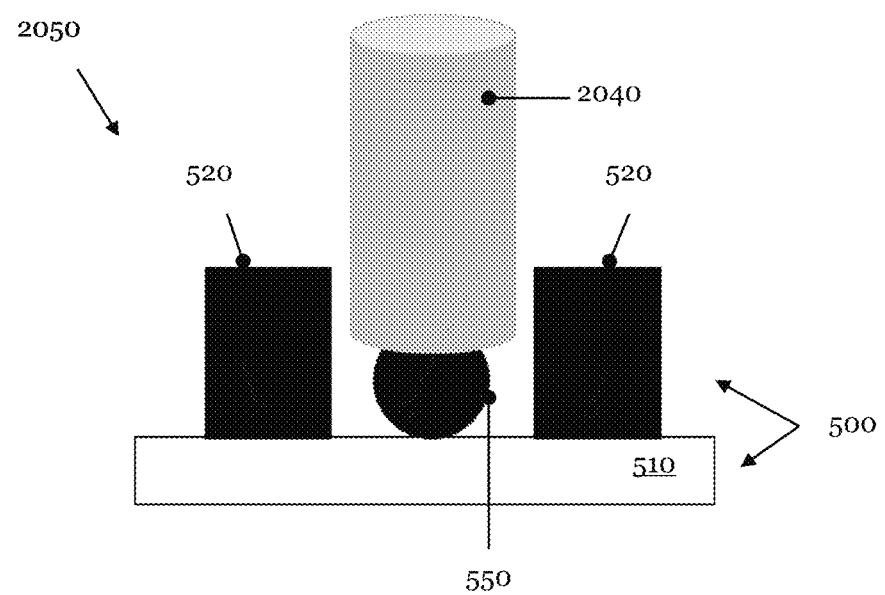

A modification of the second exemplary embodiment for the case where a small particle 550 is present on the substrate 510 of the photolithographic mask 500 between periodic line-shaped pattern elements 520 (lines and spaces) is described below within the scope of FIGS. 20 to 22. The initial configuration is elucidated in the diagram 2000 in FIG. 20. Neither the sacrificial tip 450, 1250 of the manipulator 300 nor the opening 1420 of the cantilever 1410 of the manipulator 300 can be positioned in the vicinity of the particle 550 without risk.

Similar to what was explained in the context of FIG. 18, an auxiliary structure 2040 is deposited on the particle 550 with the aid of a particle-beam-induced deposition process.

The above-described precursor gases 1820 can be used as a precursor. The diagram 2050 in FIG. 20 shows the auxiliary structure 2040 deposited on the particle 550. There is a branching of the further particle removal process at this point. In a first branch, it is possible to position the opening 1420 of the cantilever 1410 of the manipulator 1400 over the auxiliary structure 2040, similar to what was explained in FIG. 19. Then, the further course of the process is implemented on the basis of the discussion described in FIGS. 16 and 17.

A second branch is explained below on the basis of FIGS. 21 and 22. As elucidated in the diagram 2100 in FIG. 21, the auxiliary structure 2040 deposited on the particle 550 is thinned by use of an EBIE (electron beam induced etching) process in a next step. By way of example, water vapor can be used as etching gas if the main constituent of the auxiliary structure 2040 is carbon. Further possible etching gases are described above. If necessary, an additional gas in the form of an oxidation means can be mixed to the etching gas. In the example illustrated in FIG. 21, the modified auxiliary structure 2140 has a cylindrical form after completion of the etching process. The EBIE process is continued until the diameter of the modified auxiliary structure 2140 is smaller than the diameter of the opening 1420 of the cantilever 1410 of the manipulator 1400.

Figure 21:
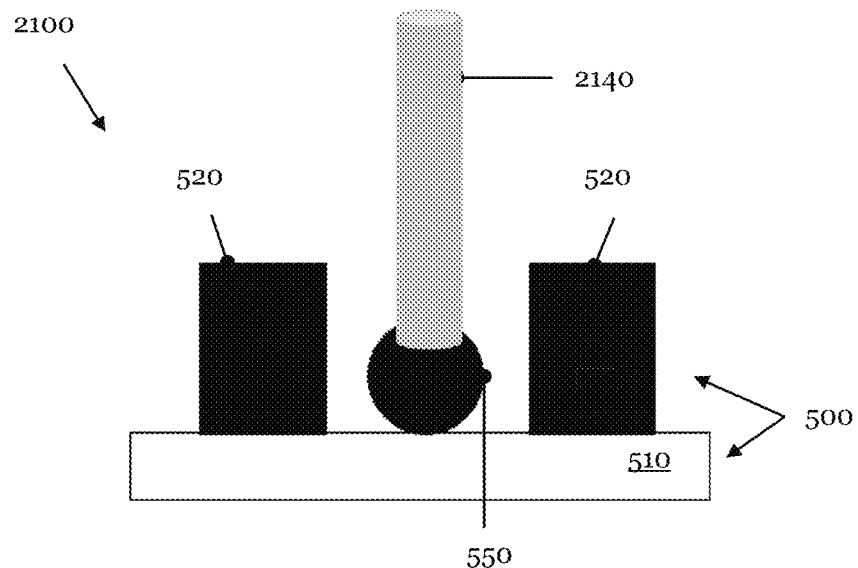
FIG. 21 reproduces, in the upper partial image (diagram 2100), the lower partial image of FIG. 20 (diagram 2050) after the auxiliary structure was thinned by carrying out a particle-beam-induced etching process and illustrates the insertion of the thinned auxiliary structure into the opening of the cantilever of the manipulator of FIG. 14 in the lower partial image (diagram 2150)
Figure 21:
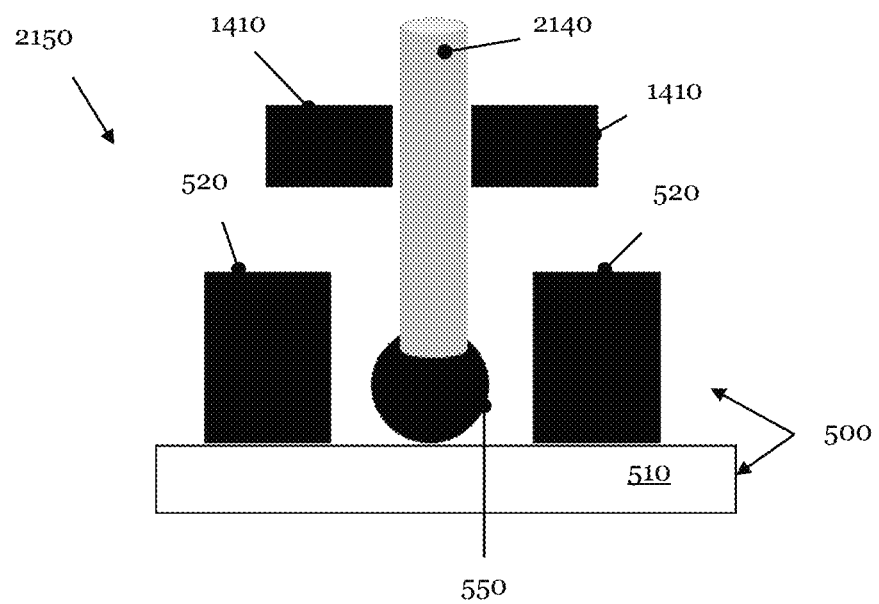
Figure 22:
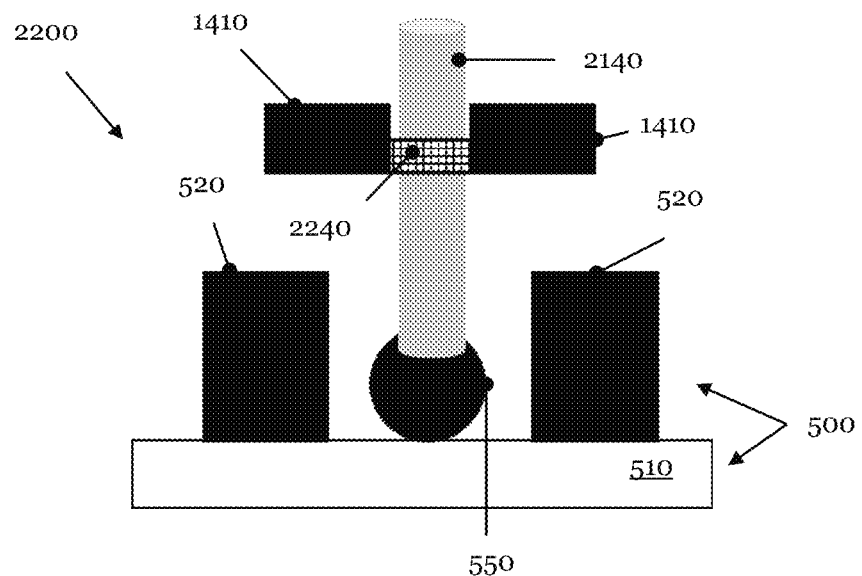
FIG. 22 elucidates, in the upper partial image (diagram 2200), the lower partial image of FIG. 21 (diagram 2150) after the deposition of connecting material on the edges of the opening of the cantilever and the modified auxiliary structure, and the lower partial image (diagram 2250) illustrates the lifting of the particle from the substrate of the photomask.
Figure 22:
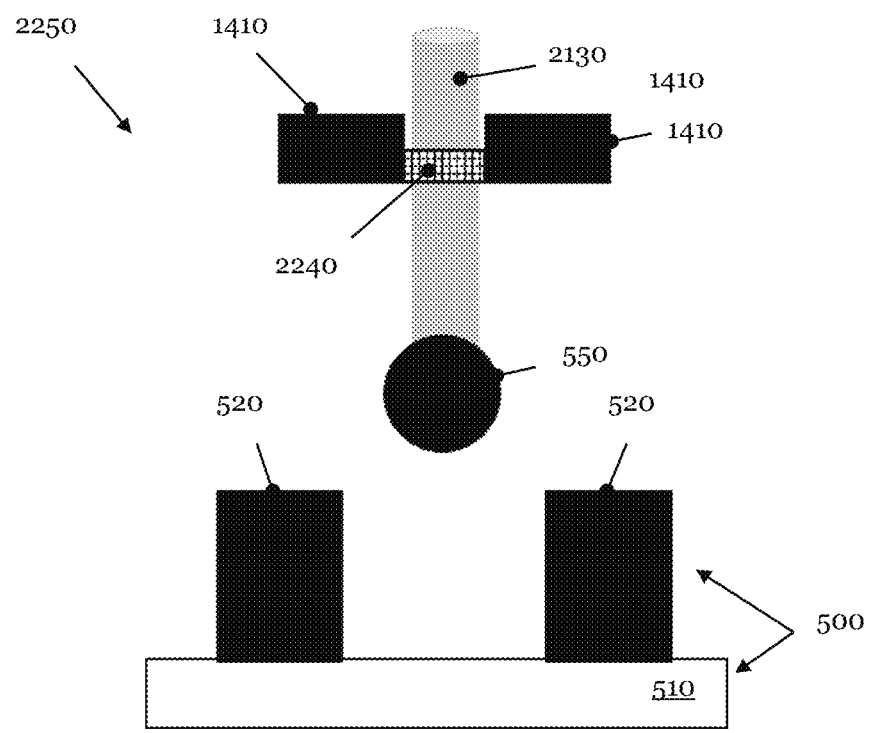

As illustrated in the diagram 2150 in FIG. 21, the opening 1420 of the cantilever 1410 is positioned over the modified auxiliary structure 2140 in the next step and the modified auxiliary structure 2140 is then introduced into the opening 1420 of the cantilever 1410. Thereupon, the particle 550 is connected to the manipulator 1400 by depositing connecting material between the edges of the opening 1420 and the modified auxiliary structure 2140. The deposition of connecting material is described above in the context of FIGS. 7, 16 and 17. In the last step, which is elucidated in the diagram 2250 in FIG. 22, the small particle 550 is lifted out of the narrow gap between the two line-shaped pattern elements 520 by carrying out a relative movement between the photomask 500 and the manipulator 1400.

Figure 23:
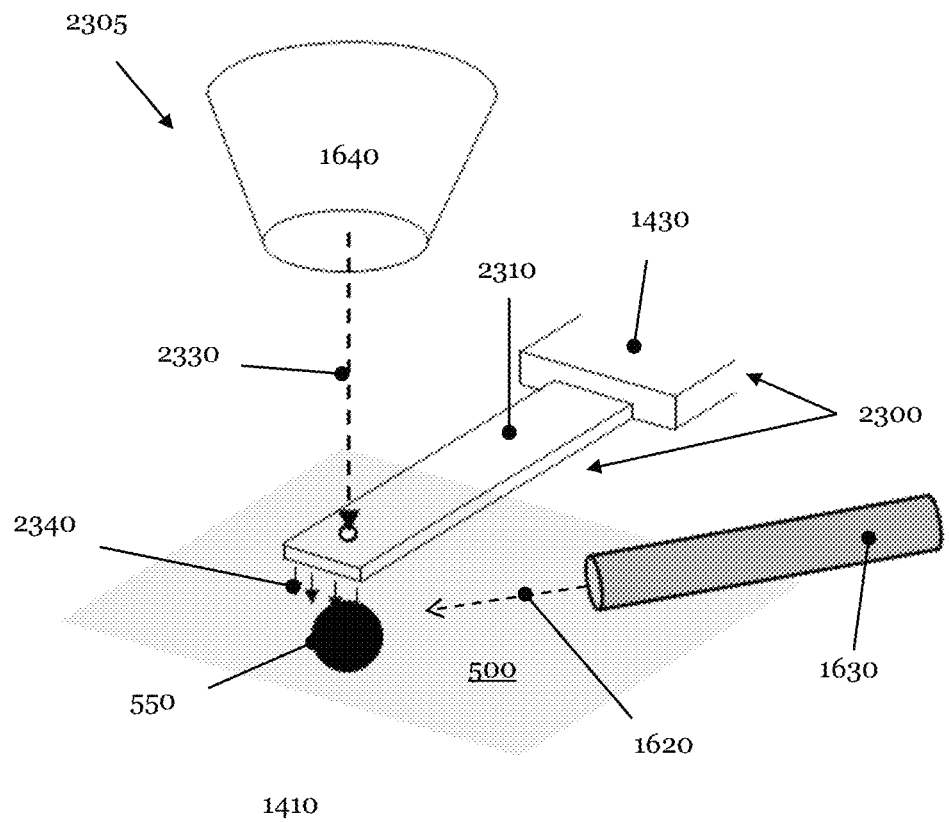
FIG. 23 schematically shows, in the upper partial image (diagram 2305), the deposition of connecting material on a particle to be removed by use of a particle-beam-induced deposition process, wherein the particle beam passes through the cantilever of the manipulator, and schematically illustrates trajectories of secondary electrons in the cantilever and between the cantilever and the particle or the substrate of the mask in the lower partial image (diagram 2355)
Figure 23:
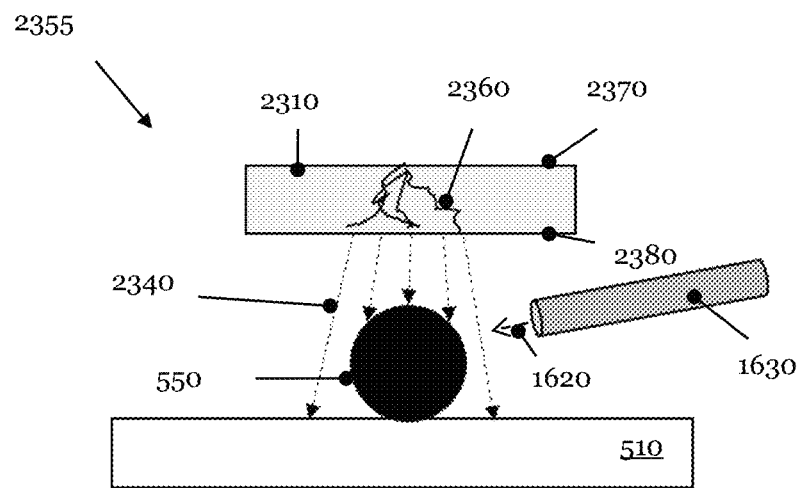
Figure 24:
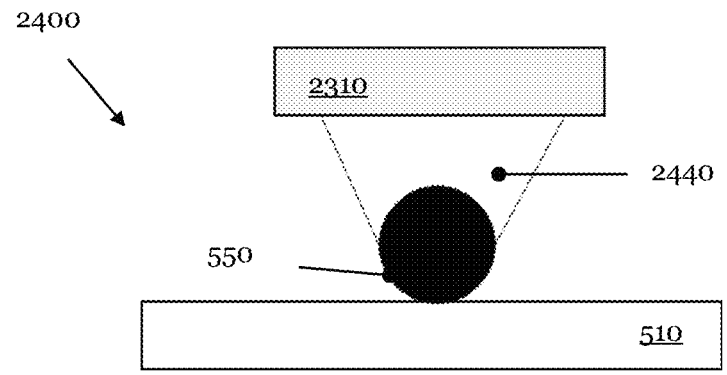
FIG. 24 presents, in the upper partial image (diagram 2400), a schematic section through the lower partial image (diagram 2355) after completion of the deposition of the connecting material between the particle and the cantilever and reproduces the lifting of the particle from the photomask in the lower partial image (diagram 2450)
Figure 24:
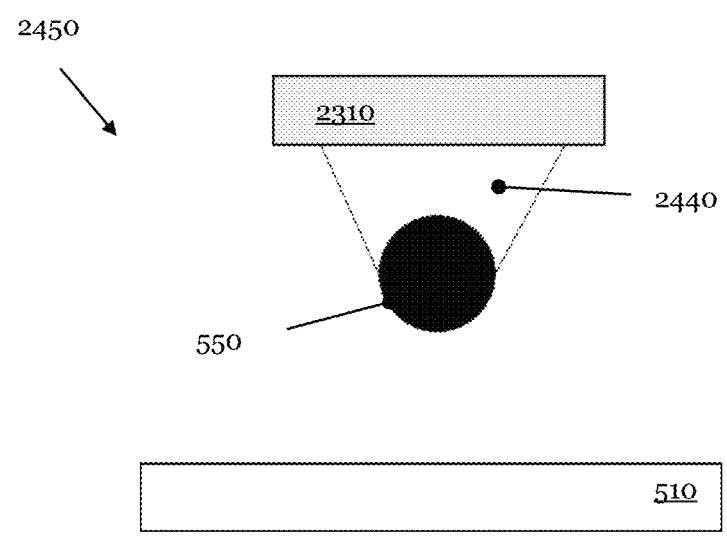

A further exemplary embodiment for removing a particle from a photolithographic mask 500 is explained on the basis of FIGS. 23 and 24. The diagram 2305 in FIG. 23 shows a manipulator 2300. The latter has a cantilever 2310 and a holding plate 1430. Unlike the manipulator 1400 of FIG. 14, the cantilever 2310 of the manipulator 2300 does not have an opening. Moreover, the cantilever 2310 has no measuring tip 320 and no sacrificial tip 450, 1250.

For the purposes of removing the particle 550 from the substrate 510 of the mask 500, the free end of the cantilever 2310 is positioned over the particle 550 in the first step. Thereupon, connecting material is deposited on the particle 550 by way of carrying out a particle-beam-induced deposition process. As explained above in the discussion to FIGS. 7, 16 and 17, a precursor gas 1620 is provided in the vicinity of the particle 550 from a gas supply system 1630 for the purposes of carrying out a particle-beam-induced deposition process. However, unlike in FIGS. 7, 16 and 17, the deposition-process-inducing particle beam 2330 is radiated onto the backside 2370 of the cantilever 2310 in the diagram 2305 in FIG. 23. The energy of the electrons of the electron beam 2330 is higher in the exemplary embodiment described here than in the electron beams 710 and 1610; i.e., the kinetic energy of the electron beam is greater than 5 keV. The electrons of the electron beam 2330 incident on the cantilever 2310 produce secondary electrons 2340 in the cantilever 2310.

The diagram 2355 in FIG. 23 shows the tracks 2360 or trajectories 2360 of some secondary electrons 2340 within the cantilever 2310 in exemplary fashion. Some of the secondary electrons 2340 produced in the cantilever 2310 can leave the front side of the cantilever 2310 through the front side 2380, i.e., the side facing the mask 500 or the particle 550. Predominantly, primary electrons 2340 scattered in the cantilever 2310 leave the front side 2380 of the cantilever 2310. These excite the precursor gas 1620 and, as a result thereof, induce the deposition of connecting material 2440 on the particle 550 and/or the front side 2380 of the cantilever 2310 from the provided precursor gas 1620.

The diagram 2400 in FIG. 24 schematically elucidates the arrangement of the deposited connecting material 2440 between the particle 550 and the front side of the cantilever 2310. The deposited connecting material 2440 connects the particle 550 to the cantilever 2310. The arrangement of the deposited connecting material 2440 reflects the distribution of the scattered electrons between the front side 2380 of the cantilever 2310 and the particle 550. As illustrated in the diagram 2450 in FIG. 24, the particle 550 that is coupled to the cantilever 2310 can be removed from the substrate 510 of the mask 500.

Figure 25:
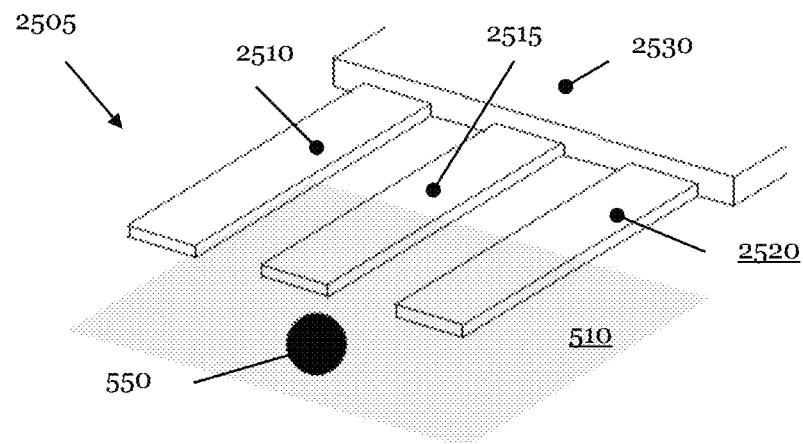
FIG. 25 shows, in the upper partial image (diagram 2505), a manipulator with a holding plate on which three cantilevers are attached and illustrates, in the central partial image (diagram 2545), the positioning of one of the cantilevers of the manipulator of the upper partial image over a particle, and the lower partial image (diagram 2575) presents the connecting of the particle with the cantilever positioned thereover by depositing connecting material.
Figure 25:
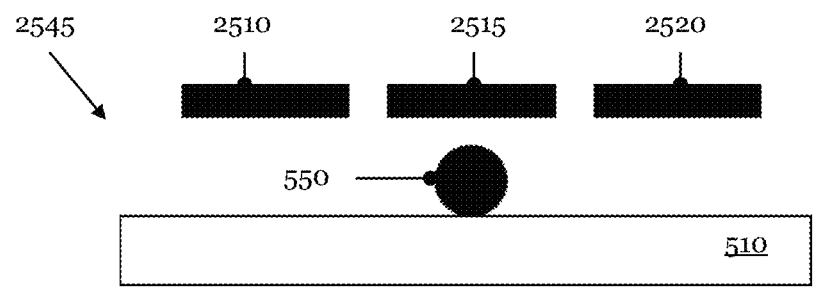
Figure 25:
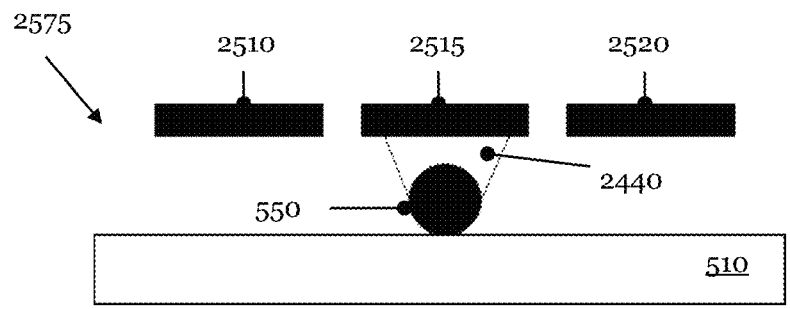

The diagram 2505 in FIG. 25 shows a further example of a manipulator. The manipulator 2500 comprises a holding plate 2530, on which three cantilevers 2510, 2515 and 2520 are attached. The holding plate 2530 with the three cantilevers 2510, 2515 and 2520 can also be referred to as a one-dimensional (1-D) probe arrangement or as part of a 1-D probe arrangement. The cantilevers 2510, 2515 and 2520 of the manipulator 2500 can comprise the cantilever 310 with a measuring tip 320 and a sacrificial tip 450, 1250, the cantilever 1410 with the opening 1420 or the cantilever 2310 without measuring tip 320 and sacrificial tip 450, 1250 and without opening 1420. In the subsequent figures, the cantilevers 2510, 2515 and 2520 have neither a measuring tip 320 nor a sacrificial tip 450, 1250 or an opening 1420 for reasons of simplicity.

In the diagram 2505 in FIG. 25, the particle 550 is localized under the cantilever 2515 on the substrate 510 of the mask 500. The diagram 2545 in FIG. 25 presents a vertical section through the diagram 2505 after the free end of the central cantilever 2515 of the manipulator 2500 was positioned over the particle 550. Additionally, the height distance between the particle 550 and the front side of the cantilever 2515 was reduced to a few nanometers by moving the holding plate 2530 of the manipulator 2500. The diagram 2575 in FIG. 25 reproduces the configuration of the diagram 2545 after the connecting material 2440 has connected the cantilever 2515 to the particle 550 by carrying out a particle-beam-induced deposition process. Possible deposition processes are described above in the context of FIGS. 7, 16 and 23.

Figure 26:
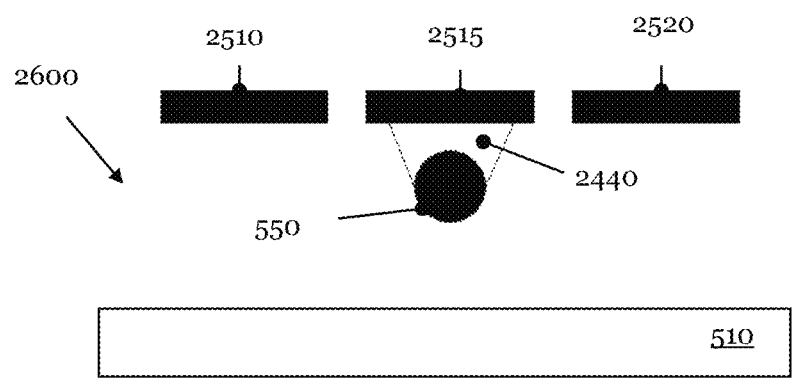
FIG. 26 represents, in the upper partial image (diagram 2600), the removal of the particle connected to a cantilever after carrying out a relative movement between the mask and the manipulator and illustrates the bending of the cantilever laden with the particle away from the photolithographic mask in the lower partial image 2650.
Figure 26:
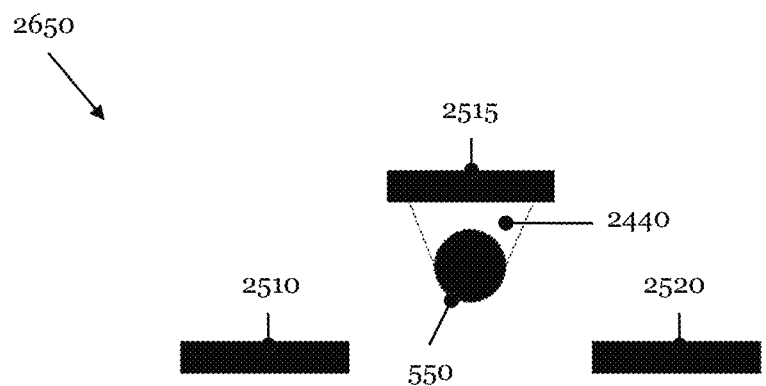

The diagram 2600 in FIG. 26 shows lifting of the particle 550, which is connected to the cantilever 2515, after carrying out a relative movement between the manipulator 2500 and the photomask 500.

The diagram 2650 in FIG. 26 illustrates the bending away from the photomask 500 of the cantilever 2515 of the manipulator 2500 loaded with a particle 550. Various options for temporarily bending, or activating and deactivating, a cantilever are described within the scope of the discussion in relation to FIG. 3. Further, measurement options that facilitate the detection of a bend or a curvature of a cantilever are discussed there.

In order to permanently bend a cantilever, the latter can be manufactured from a shape memory material, for example a shape memory alloy or a shape memory polymer. Moreover, it is possible to cause a phase transition in a cantilever, said phase transition bringing about a bending of the cantilever. Nitinol, an alloy of nickel and titanium, is a frequently employed memory alloy. A permanent bend of a cantilever 2510, 2515 and 2520 is disadvantageous to the extent that this cantilever can be used to remove only a single particle 550.

Moreover, the cantilever 2515 loaded with a particle 550 can be removed from the holding plate 2530 with the aid of a particle-beam-induced etching process.

Figure 27:
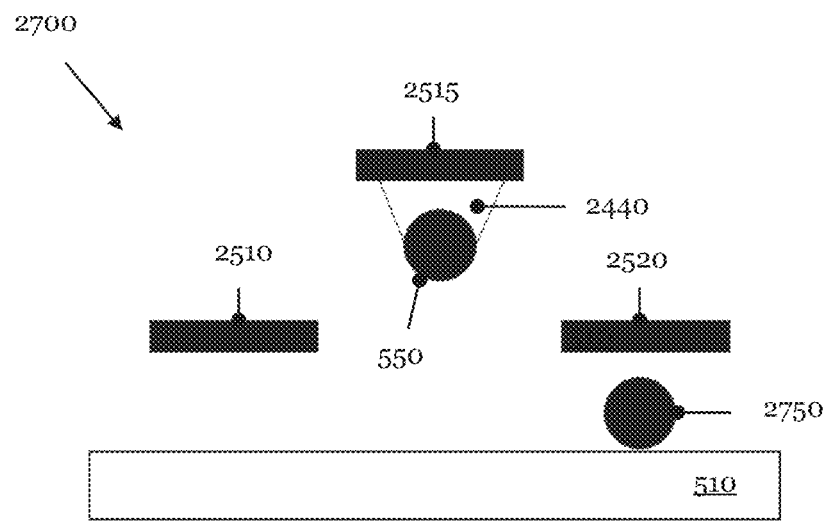
FIG. 27 shows, in the upper partial image (diagram 2700), a vertical section of the positioning of a second cantilever of the manipulator of FIG. 25 over a second particle, and the lower partial image (diagram 2750) reproduces a schematic perspective illustration of the diagram 2700.
Figure 27:
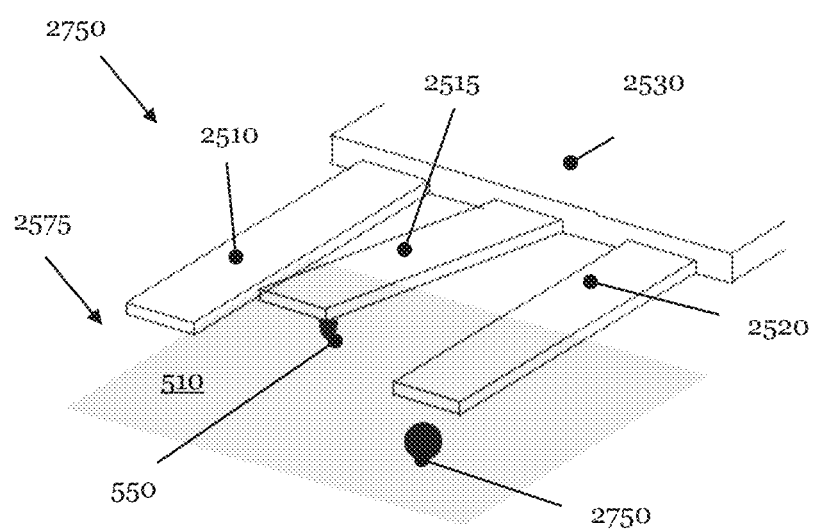

The cantilevers 2510, 2515 and 2520 are not deflected in the exemplary embodiment explained on the basis of FIGS. 26 and 27. Instead, the manipulator 2550 is moved as a whole. Only once a cantilever 2515 has been loaded with a particle 550 is said cantilever bent away from the mask so that the mask 500 cannot be damaged when removing a further particle with one of the still unladen cantilevers 2510 and 2520.

The diagram 2700 in FIG. 27 presents the configuration of the diagram 2650 in FIG. 26 after positioning the cantilever 2520 over a second particle 2750 to be removed. The next step of depositing connecting material 2440 on the second particle 2750 is explained in the diagram 2600 in FIG. 26. Finally, the diagram 2750 in FIG. 27 shows the configuration of the diagram 2700 from a perspective view.

After loading a cantilever 2510, 2515 and 2520 with a particle 550, 2750, the particles 550, 2750 can be separated from the cantilevers 2510, 2515 and 2520 with the aid of a particle-beam-induced etching process, for example an EBIE process, optionally after carrying out an appropriate analysis process for determining the material composition, and the manipulator 2500 is subsequently available for a further particle removal process.

Figure 28:
FIG. 28 illustrates, in the upper partial image (diagram 2800), the alignment of a cantilever of the manipulator of FIG. 25 over a particle and reproduces, in the central partial image (diagram 2835), the lowering of the aligned cantilever on, or into the vicinity of, the particle, and the lower partial image (diagram 2870) shows the connecting of the lowered cantilever with the particle.
Figure 28:
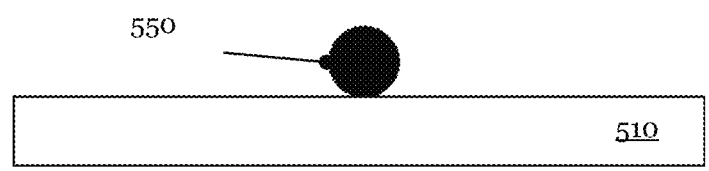
Figure 28:
Figure 28:
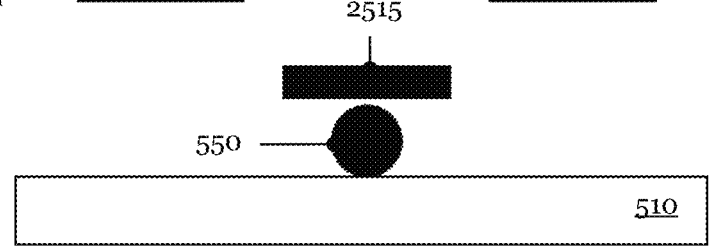
Figure 28:
Figure 28:
Figure 28:
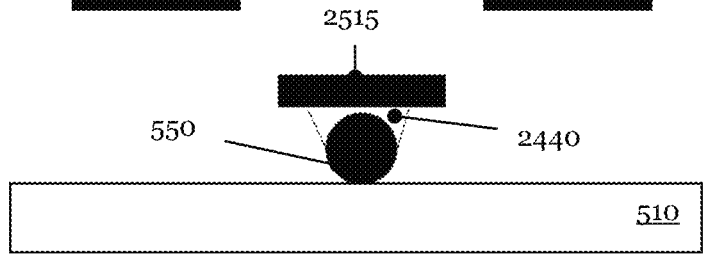
Figure 29:
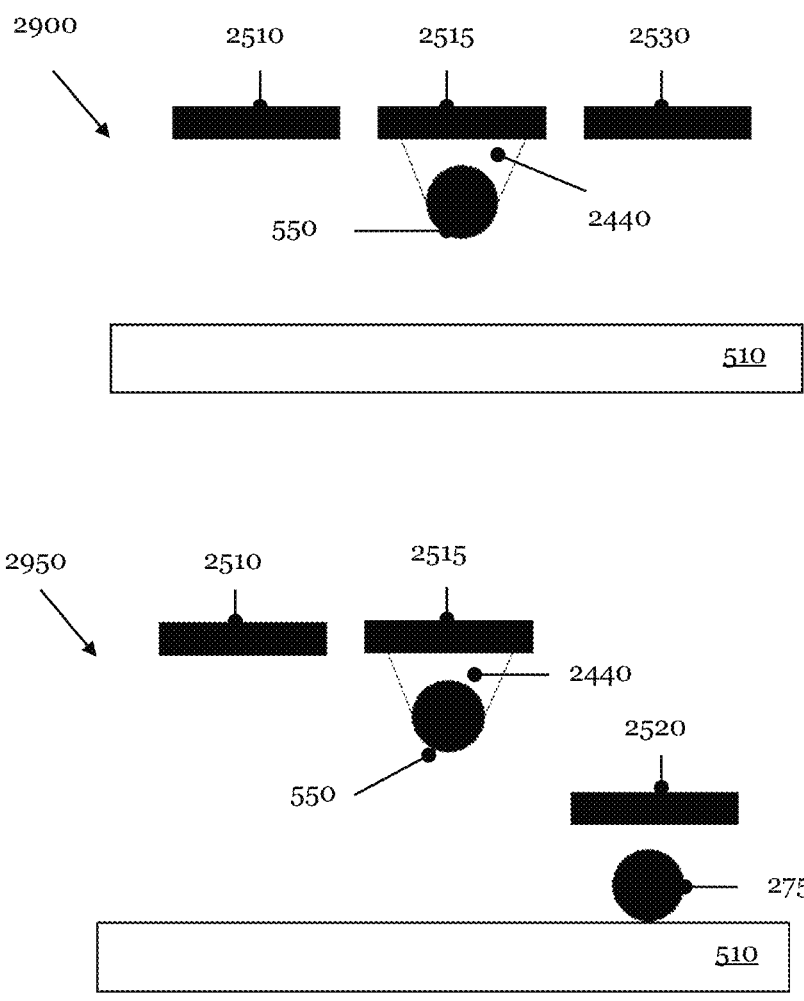
FIG. 29 illustrates, in the upper partial image (diagram 2900), the lifting of the particle and the undoing of the bending of the cantilever connected to the particle and reproduces, in the lower partial image (diagram 2950), the lowering of a second cantilever of the manipulator of FIG. 25 on a particle that is aligned in relation to a second cantilever.

FIGS. 28 and 29 reproduced the sequence of the particle removal of FIGS. 26 and 27 with the difference that, in FIGS. 28 and 29, it is not the manipulator 2500 and hence all cantilevers 2510, 2515 and 2520 that are lowered onto or into the vicinity of the particle 550, 2750, but only the cantilever 2515 and 2520, respectively, that receives the particle 550, 2750. The embodiment in FIGS. 28 and 29 is advantageous as only the cantilever 2515 or 2520 to be loaded is brought into the direct vicinity of the mask 500 or the particle 550, 2750 and the other cantilevers are withdrawn from a possible unwanted interaction with the photomask 500.

Figure 30:
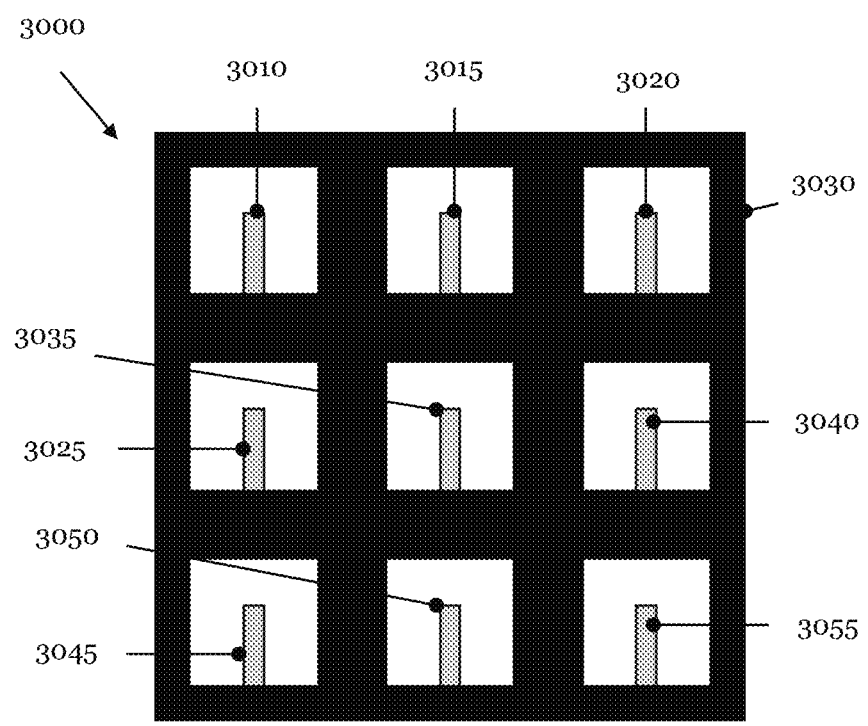
FIG. 30 presents a schematic plan view of a further example of a manipulator, which comprises a two-dimensional arrangement of cantilevers.

FIG. 30 shows a plan view of a manipulator 3000, which is embodied in the form of a two-dimensional (2-D) probe arrangement or a 2-D probe array. The manipulator 3000 comprises a holding plate 3030 and nine cantilevers 3010, 3015, 3020, 3025, 3035, 3040, 3045, 3050 and 3055 in the example illustrated in FIG. 30. The cantilevers 3010 to 3055 of the manipulator 3000 can comprise cantilevers 310 with a measuring tip 320 and/or a sacrificial tip 450, 1250, or can be cantilevers 1410 with an opening 1420 and/or can comprise cantilevers 2310 without measuring tip 320 and sacrificial tip 450, 1250 and without opening 1420, respectively.

If the 2-D probe arrangement of the manipulator 3000 becomes too big, it can be difficult to position the manipulator 3000 in accordance with the individual particles 550, 2750 to be removed without damaging the mask 500 and/or the probe arrangement of the manipulator 3000. This is particularly the case if the mask 500 should have an electrostatic charge.

Figure 31:
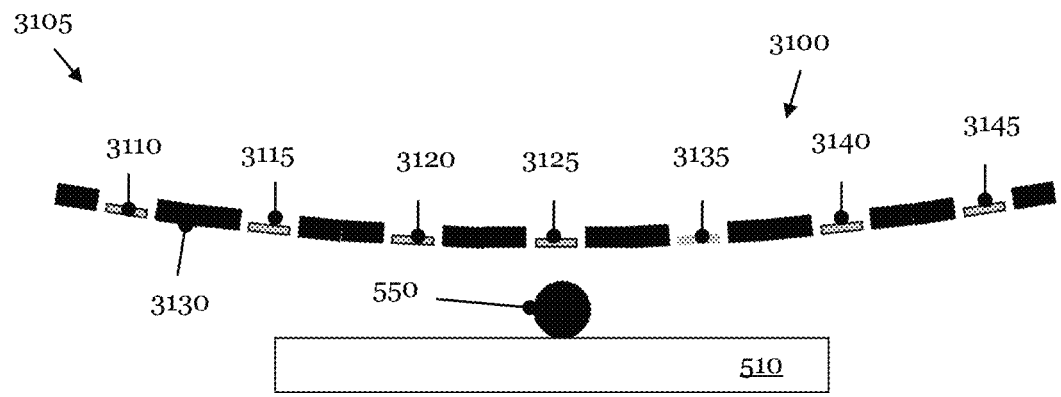
FIG. 31 shows a section through a curved manipulator, which comprises a 7×7 cantilever arrangement, wherein the central cantilever is positioned over a first particle in the upper partial image (diagram 3100), the central cantilever has taken the first particle in the central partial image and the second cantilever of the manipulator from the left is aligned over a second particle (diagram 3135), and the second cantilever from the left has taken the second particle and the second cantilever from the right is aligned in relation to a third particle in the lower partial image (diagram 3170)
Figure 31:
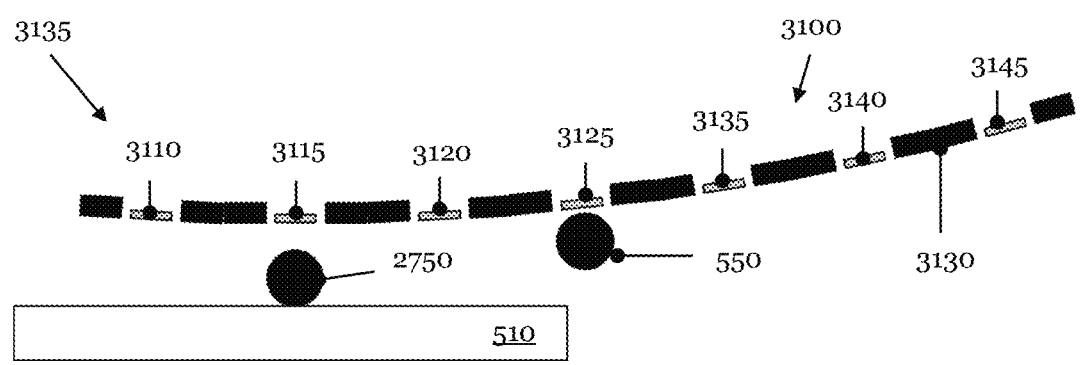
Figure 31:
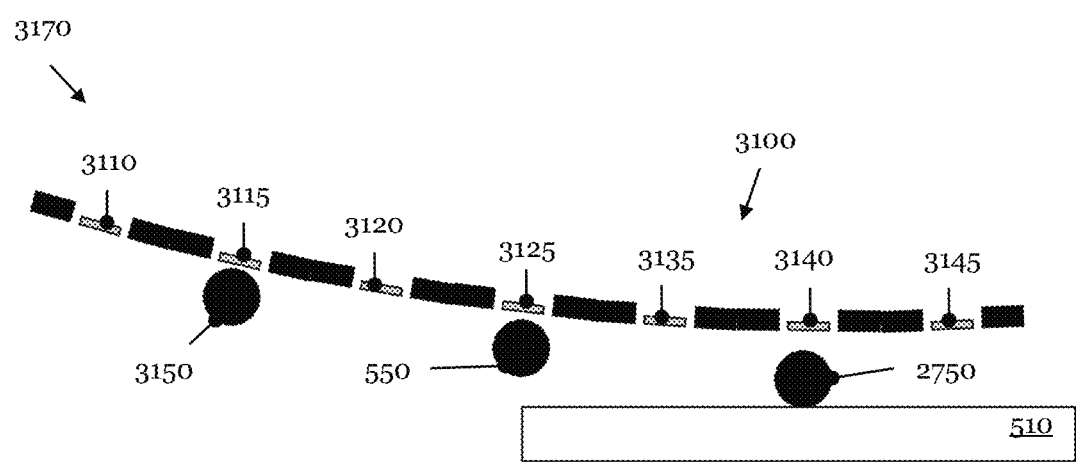

FIG. 31 presents a section through a manipulator 3100 which at least partly avoids this problem. The manipulator 3100 in FIG. 31 has a holding plate 3130 that is curved about a vertical axis. The manipulator 3100 can additionally have a second curvature about a horizontal axis. The radii of curvature of the two curvatures of the holding plate 3130 can be the same or different.

The manipulator 3100 has a probe array with 7×7 cantilevers. The section illustrated in FIG. 31 passes through the cantilevers 3110, 3115, 3120, 3125, 3135, 3140, 3145. The diagram 3105 shows the approach or the positioning of the cantilever 3125 of the manipulator 3100 over the particle 550. After the cantilever 3125 is positioned over the particle 550, the particle 550 is connected to the cantilever 3125 by depositing the connecting material 2440 between the particle 550 and the cantilever 3125. The connecting material 2440 is suppressed in FIG. 31 for reasons of simplicity.

The diagram 3135 in FIG. 31 shows the cantilever 3125 laden with the particle 550 and the lowering of the manipulator 3100 such that the cantilever 3115 comes to rest over a second particle 2750 of the mask 500. The particle 2750 is connected to the cantilever 3125 by depositing connecting material 2440 on the particle 2750 and/or the cantilever 3115 of the manipulator 3100.

The diagram 3170 elucidates an arrangement in which the manipulator 3100, which has already taken the particles 550 and 2750, is placed over a third particle 3150 such that the cantilever 3140 can be connected to the particle 3150—once again by carrying out a particle-beam-induced deposition process.

Figure 32:
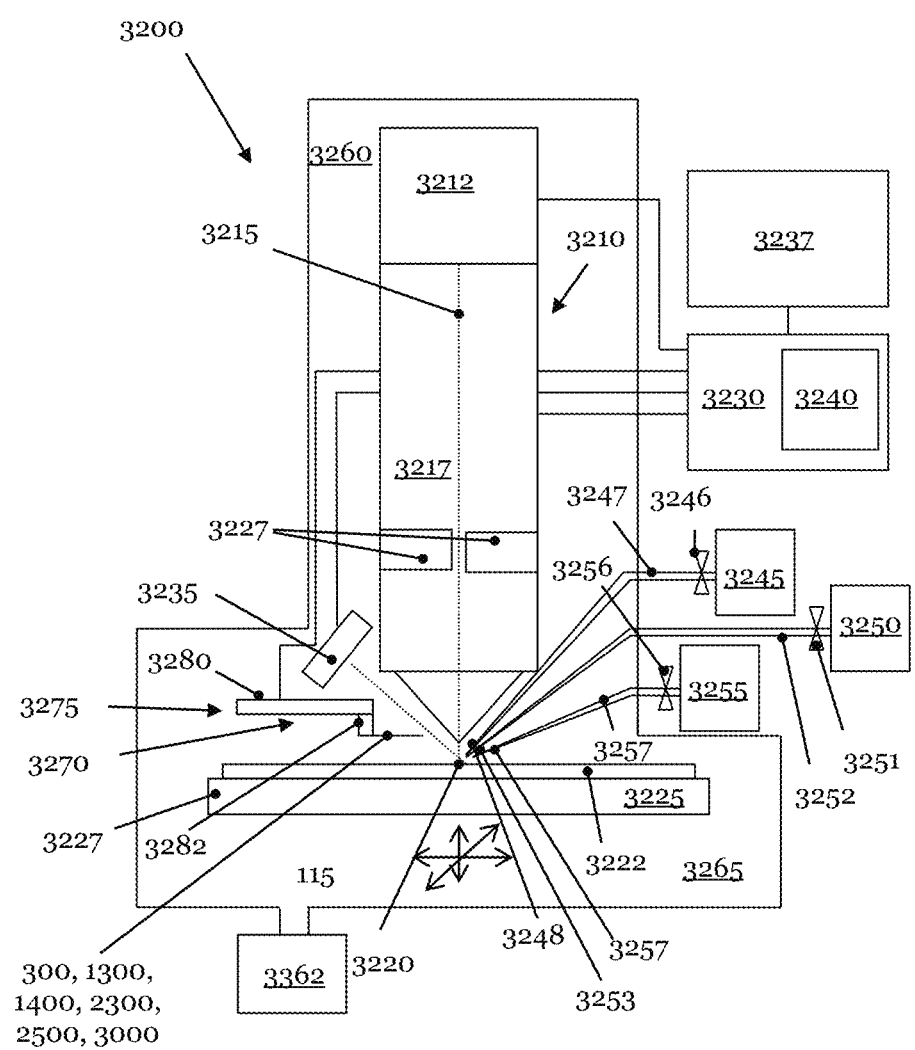
FIG. 32 shows a schematic section through an apparatus, with the aid of which one of the described methods can be carried out.

FIG. 32 shows a schematic section through some important components of an apparatus 3200 with which a method according to the invention can be performed. The apparatus 3200 comprises a modified scanning particle microscope 3210 in the form of a scanning electron microscope (SEM) 3210 and a scanning probe microscope 3270 in the form of an atomic force microscope (AFM) 3270. It is also possible for the apparatus 3200 to comprise a manipulator apparatus (not shown in FIG. 32) in place of the scanning probe microscope 3270 or in addition to the scanning probe microscope 3270.

In the SEM 3210 of FIG. 32, an electron gun 3212 produces an electron beam 3215, which is directed as a focused electron beam onto the position 3220 on the sample 3222 that can comprise the mask 500 by the imaging elements, not illustrated in FIG. 32, arranged in the column 3217. The sample 3222 is arranged on a sample stage 3225 (or stage). Further, the imaging elements of the column 3217 of the SEM 3210 can scan the electron beam 3215 over the sample 3222. The sample 3222 can be examined using the electron beam 3215 of the SEM 3210. Further, the electron beam 3215 can be used to induce a particle-beam-induced deposition process and/or an EBIE process. Further, the electron beam 3215 of the SEM 3210 can be used to analyze a particle 550, 2750, 3150.

The electrons backscattered from the electron beam 3215 by the sample 3222 and the secondary electrons produced by the electron beam 3215 in the sample 3222 are registered by the detector 3227. The detector 3227 that is arranged in the electron column 3217 is referred to as an "in lens detector." The detector 3227 can be installed in the column 3217 in various embodiments. The detector 3227 is controlled by the control device 3230 of the apparatus 3200.

The apparatus 3200 contains a second detector 3235. The second detector 3235 is designed to detect electromagnetic radiation, particularly in the x-ray region. As a result, the detector 3235 facilitates the analysis of the particles 550, 2750, 3150 that are excited by the electron beam 3215 in order to determine the material composition of said particles. The sample stage 3225 is lowered and/or the sample 3222 is removed from the beam direction of the electron beam 3215 during the analysis of the particles 550, 2750, 3150. The detector 3235 is likewise controlled by the control device 3230.

Further, the apparatus 3200 can comprise a third detector (not illustrated in FIG. 32). The third detector is often embodied in the form of an Everhart-Thornley detector and typically arranged outside of the column 2317. As a rule, it is used to detect secondary electrons.

The apparatus 3200 can comprise an ion source that provides ions with low kinetic energy in the region of the particles 550, 2750, 3150 (not illustrated in FIG. 32). The ions with a low kinetic energy can compensate a charging of a particle 550, 2750, 3150 and/or of a manipulator 300, 1300, 1400, 2300, 2500, 3000. Further, the apparatus 3200 can have a mesh on the output of the column 3217 of the modified SEM 3210 (not shown in FIG. 32). It is likewise possible to compensate electrostatic charging of a particle (550, 2750, 3150) and/or a manipulator 300, 1300, 1400, 2300, 2500, 3000, 3100 by applying a voltage to the mesh. It is furthermore possible to earth the mesh. The two elements sketched out in this paragraph therefore form a charging compensation system on their own or in combination.

The control device 3230 and/or the computer system 3240 can set the parameters of the electron beam 3215 for inducing a deposition process or an EBIE process and for analyzing the particles 550, 2750, 3150. Further, the control device 3230 of the apparatus 3200 receives the measurement data of the detector 3227, of the detector 3235 and/or of the Everhart-Thornley detector. The control device 3230 can generate images from the measurement data, said images being represented on a monitor 3237.

As already explained above, the electron beam 3215 of the modified SEM 3210 can be used to induce an electron-beam-induced deposition process and an EBIE process. The exemplary scanning electron microscope 3210 of FIG. 32 has three different supply containers 3245, 3250 and 3255 for the purposes of carrying out these processes.

The first supply container 3245 stores a first precursor gas 720, 1150, 1620, 1820, for example a metal carbonyl, for instance chromium hexacarbonyl ($Cr(CO)_6$), or a carbon-containing precursor gas, such as styrene, for instance. With the aid of the precursor gas stored in the first supply container 3245, a sacrificial tip 450, connecting material 730, 1730, 2440 and/or an auxiliary structure 1840, 2040 can be deposited within the scope of a local chemical reaction on the measuring tip 320, the cantilever 310, 1410, 2310, 2510, 2515, 2520, 3010 to 3055 and 3115 to 3145 and/or the particle 550, 2750, 3150, wherein the electron beam 3215 of the SEM 3210 acts as an energy supplier for splitting the precursor gas stored in the first supply container 3245 at the position where material should be deposited. This means that an EBID (electron beam induced deposition) process for local deposition of a sacrificial tip 450, connecting material 730, 1730, 2440 and/or an auxiliary structure 1840, 2040 is carried out by the combined provision of an electron beam 3215 and a precursor gas. The modified SEM 3210 forms a deposition apparatus in combination with the first supply container 3245.

An electron beam 3215 can be focused onto a spot diameter of a few nanometers. As a result, an EBID process allows the local deposition of connecting material 730, 1730, 2440 with a spatial resolution in the low two-digit nanometer range.

In the apparatus 3200 illustrated in FIG. 32, the second supply container 3250 stores an etching gas 920, which makes it possible to perform a local electron beam induced etching (EBIE) process. A particle 550, 2750, 3150 can be removed from a sacrificial tip 450, 1250, a measuring tip 320, 1320 and/or a cantilever 310, 1410, 2310, 2510, 2515, 2520, 3010 to 3055 and 3115 to 3145 with the aid of an electron-beam-induced etching process. An etching gas can comprise for example xenon difluoride ($XeF_2$), chlorine ($Cl_2$), oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$), nitrosyl chloride (NOCl), nitric acid ($HNO_3$), ammonia ($NH_3$) or sulfur hexafluoride ($SF_6$). Consequently, the modified SEM 3210 forms a separating apparatus in combination with the second supply container 3250.

An additive or an additional gas can be stored in the third supply container 3255, said additive or additional gas being able to be added to the etching gas 920 kept available in the second supply container 3250 or to the precursor gas 720, 1150, 1620, 1820 stored in the first supply container 3245 where necessary. Alternatively, the third supply container 3255 can store a second precursor gas or a second etching gas.

In the scanning electron microscope 3210 illustrated in FIG. 32, each of the supply containers 3245, 3250 and 3255 has its own control valve 3246, 3251 and 3256 in order to monitor or control the amount of the corresponding gas that is provided per unit time, i.e., the gas volumetric flow at the location 3220 of the incidence of the electron beam 3215 on the sample 3222. The control valves 3246, 3251 and 3256 are controlled and monitored by the control device 3230. Using this, it is possible to set the partial pressure conditions of the gas or gases provided at the processing location 3220 for carrying out an EBID and/or EBIE process in a wide range.

Furthermore, in the exemplary SEM 3210 in FIG. 32, each supply container 3245, 3250 and 3255 has its own gas feedline system 3247, 3252 and 3257, which ends with a nozzle 3248, 3253 and 3258 in the vicinity of the point of incidence 3220 of the electron beam 3215 on the sample 3222.

The supply containers 3245, 3250 and 3255 can have their own temperature setting element and/or control element, which allows both cooling and heating of the corresponding supply containers 3245, 3250 and 3255. This makes it possible to store and, e.g., provide the precursor gas and/or the etching gas(es) 920 at the respectively optimum temperature (not shown in FIG. 32). The control device 3230 can control the temperature setting elements and the temperature control elements of the supply containers 3245, 3250, 3255. During the EBID and the EBIE processing processes, the temperature setting elements of the supply containers 3245, 3250 and 3255 can further be used to set the vapor pressure of the precursor gases 720, 1150, 1620, 1820 stored therein by way of the selection of an appropriate temperature.

The apparatus 3200 can comprise more than one supply container 3245 in order to store two or more precursor gases 720, 1550, 1620, 1820. Further, the apparatus 3200 can comprise more than one supply container 3250 in order to store two or more etching gases 920.

The scanning electron microscope 3210 illustrated in FIG. 32 is operated in a vacuum chamber 3260. Implementing the EBID and EBIE processes necessitates negative pressure in the vacuum chamber 3260 relative to the ambient pressure. For this purpose, the SEM 3210 in FIG. 32 comprises a pump system 3262 for generating and for maintaining a reduced pressure used in the vacuum chamber 3260. With closed control valves 3246, 3251 and 3256, a residual gas pressure of <10⁴ Pa is achieved in the vacuum chamber 3260. The pump system 3262 can comprise separate pump systems for the upper part of the vacuum chamber 3260 for providing the electron beam 3215 of the SEM 3210 and for the lower part 3265 or the reaction chamber 3265 (not shown in FIG. 32).

Additionally, the exemplary apparatus 3200 illustrated in FIG. 32 comprises a scanning probe microscope 3270 which, in the apparatus 3200, is embodied in the form of a scanning force microscope 3270 or an atomic force microscope (AFM) 3270. The scanning probe microscope 3270 can receive the manipulators 300, 1400, 2300, 2500, 3000, 3100. Moreover, the AFM 3270 can be used to examine the photomask 500 and/or to analyze the particle 550, 2750, 3150.

The measuring head 3275 of the scanning probe microscope 3270 is illustrated in the apparatus 3200 of FIG. 32. The measuring head 3275 comprises a holding apparatus 3280. The measuring head 3275 is fastened to the frame of the apparatus 3200 by use of the holding apparatus 3280 (not shown in FIG. 32). A piezo-actuator 3282 which facilitates a movement of the free end of the piezo-actuator 3282 in three spatial directions (not illustrated in FIG. 32) is attached to the holding apparatus 3280 of the measuring head 3275. A manipulator 300, 1300, 1400, 2300, 2500, 3000 is fastened to the free end of the piezo-actuator 3282. FIG. 32 provides an example of a cantilever 300. The free end of the cantilever of the manipulator 300, 1300, 1400, 2300, 2500, 3000 has a measuring tip 320, 1320, a sacrificial tip 450, 1250, a measuring tip 320, 1320 and a sacrificial tip 450, 1250, an opening 1420 or none of these elements.

The measuring head 3275 of the AFM 3270 is rotatably mounted about its holding apparatus 3280 such that the measuring tip 3290 of the AFM 3270 is rotatable about an axis that is parallel to the surface of the sample 3222 or of the photomask 500 (not illustrated in FIG. 32).

In addition or as an alternative to the scanning probe microscope 3270, the apparatus 3200 can comprise a manipulator apparatus with a manipulator head for receiving the manipulators 300, 1400, 2300, 2500, 3000, 3100 (not shown in FIG. 32). The manipulator apparatus can be controlled by the control device 3270.

As symbolized by arrows in FIG. 32, the sample stage 3225 can be moved by a positioning system 3227 in three spatial directions relative to the measuring head 3275 of the AFM 3270 and/or the point of incidence 3220 of an electron beam 3215. In the example in FIG. 32, the positioning system 3227 is embodied in the form of a plurality of micromanipulators or displacement elements. The movement of the sample stage 3225 in the sample plane, i.e., in the xy-plane, which is perpendicular to the beam direction of the electron beam 3215, can be controlled by two interferometers (not shown in FIG. 32). In an alternative embodiment, the positioning system 3227 can additionally contain piezo-actuators (not illustrated in FIG. 32). The positioning system 3227 is controlled by signals of the control device 3230. In an alternative embodiment, the control device 3230 does not move the sample stage 3225, but rather the holding apparatus 3280 of the measuring head 3275 of the AFM 3270. It is furthermore possible for the control device 3230 to perform a coarse positioning of the sample 3222 or the mask 500 in height (z-direction) and for the piezo-actuator 3282 of the measuring head 3280 to perform a precise height setting of the AFM 3270. The control device 3230 can be part of a computer system 3240 of the apparatus 3200.

The AFM 3270 can be used to position the manipulator 300, 1300, 1400, 2300, 2500, 3000, 3100 in relation to a particle 550, 2750, 3150. Further, the AFM 3270 can be used to remove a manipulator 300, 1300, 1400, 2300, 2500, 3000 laden with a particle 550 2750, 3150 by way of movement from the photolithographic mask 500.

Figure 33:
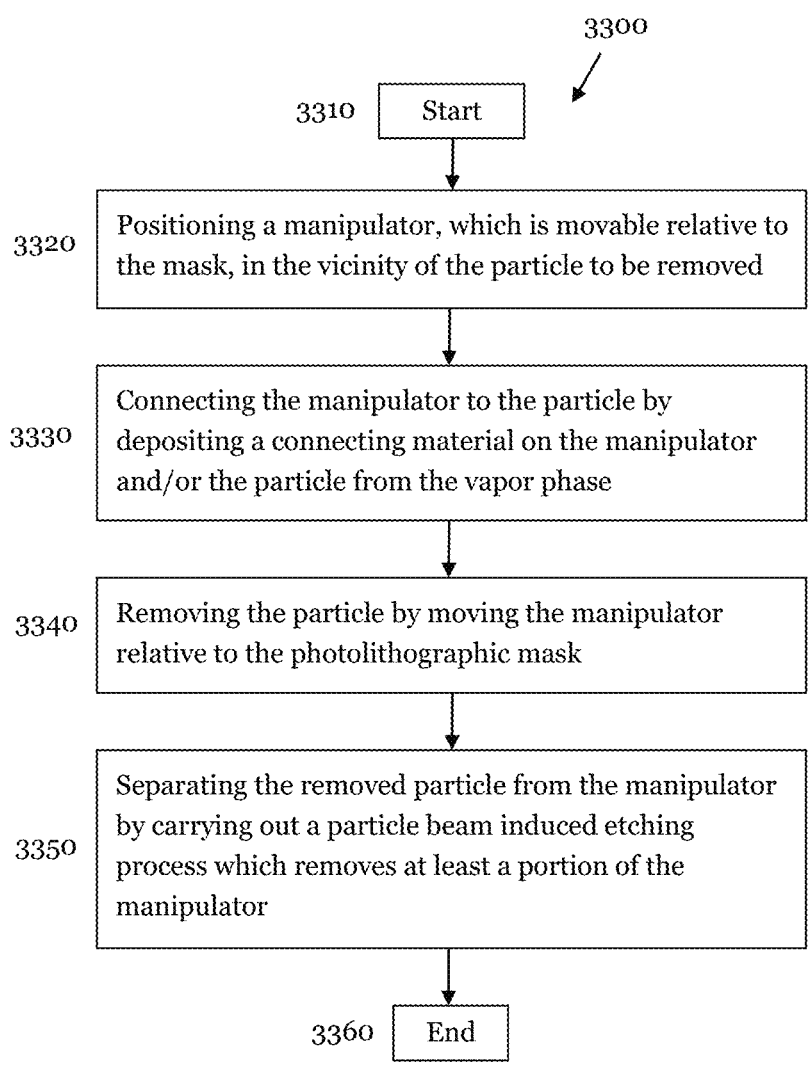
FIG. 33 reproduces a flowchart of a first embodiment of the method according to the invention.

The flowchart 3300 in FIG. 33 schematically presents the procedure of removing a particle 550, 2750, 3150 from a photolithographic mask 500. The method begins in step 3310. In step 3320, a manipulator 300, 1300, 2500, 3000, 3100, which is movable relative to the mask 500, is positioned in the vicinity of the particle 550, 2750, 3150 to be removed. In the next step 3330, the manipulator 300, 1400, 2300, 2500, 3000, 3100 is connected to the particle 550, 2750, 3150 by depositing connecting material 730, 1730, 2440 on the manipulator 300, 1400, 2300, 2500, 3000, 3100 and/or on the particle 550, 2750, 3150 from the vapor phase. Subsequently, in step 3340, the particle 550, 2750, 3150 is removed by moving the manipulator 300, 1400, 2300, 2500, 3000 relative to the photolithographic mask 500. Thereupon, in step 3350, the removed particle 550, 2750, 3150 is removed from the manipulator 300, 1300, 2500, 3000, 3100 by carrying out a particle-beam-induced etching process, wherein the at least one particle-beam-induced etching process removes at least a portion of the manipulator 300, 1300, 2500, 3000, 3100. Finally, the method ends in step 3360.

Figure 34:
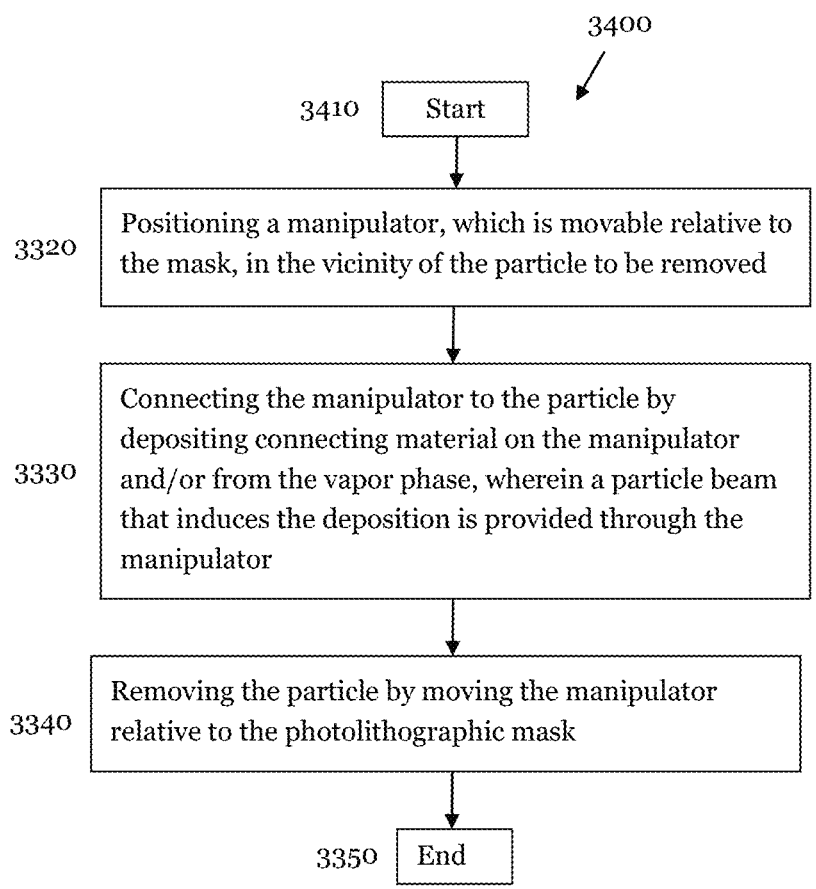
FIG. 34 finally presents a flowchart of a second embodiment of the method according to the invention.

Finally, the flowchart 3400 in FIG. 34 schematically shows the procedure of removing a particle 550, 2750, 3150 from a photolithographic mask 500. The method begins in step 3410. In step 3420, a manipulator 1400, 2300, 2500, 3000, 3100, which is movable relative to the mask 500, is positioned in the vicinity of the particle 550, 2750, 3150 to be removed. In the next step 3430, the manipulator 1400, 2300, 2500, 3000, 3100 is connected to the particle 550, 2750, 3150 by depositing connecting material 730, 1730, 2440 on the manipulator 1400, 2300, 2500, 3000, 3100 and/or the particle 550, 2750, 3150 from the vapor phase, wherein a particle beam 1610, 2330 that induces the deposition is provided through the manipulator 1400, 2300, 2500, 3000, 3100. Subsequently, in step 3440, the particle 550, 2750, 3150 is removed by moving the manipulator 1400, 2300, 2500, 3000, 3100 relative to the photolithographic mask 500. Finally, the method ends in step 3450.

What is claimed is:

1. An apparatus for removing a particle from a photolithographic mask, comprising:
   a. a manipulator, which is movable relative to the mask and which is movable into the vicinity of the particle to be removed; and
   b. a deposition apparatus, which is embodied to deposit a connecting material on the manipulator and/or on the particle from a vapor phase in order to connect the manipulator to the particle, wherein the deposition apparatus is further embodied to provide through the manipulator a particle beam that induces the deposition, wherein the deposition apparatus comprises a gas supply system configured to supply at least one precursor gas, wherein the at least one precursor gas when induced by the particle beam is configured to facilitate deposition of the connecting material.

2. The apparatus of claim 1, wherein the apparatus comprises a separating apparatus, which is embodied to separate the removed particle from the manipulator.

3. The apparatus of claim 1, wherein the manipulator defines an opening.

4. The apparatus of claim 3, wherein a diameter of the opening of the manipulator is smaller than a diameter of a particle to be removed.

5. The apparatus of claim 3, wherein the diameter of the opening is within a range of 30 nm to 70 nm.

6. The apparatus of claim 3, wherein the opening has a form of a circle, a triangle, a rectangle or a square.

7. The apparatus of claim 1, further comprising a detector for detecting x-ray radiation.

8. The apparatus of claim 1, wherein the gas supply system is configured to provide at least one precursor gas for depositing the connecting material at a position of the manipulator, in which the at least one precursor gas comprises at least one of ethene, styrene, pyrene, hexadecane, liquid paraffins, formic acid, acrylic acid, propionic acid, or methyl methacrylate.

9. An apparatus for removing a particle from a photolithographic mask, comprising:
   a. a manipulator, which is movable relative to the mask and which is movable into the vicinity of the particle to be removed; and
   b. a deposition apparatus, which is embodied to deposit a connecting material on the manipulator and/or on the particle from a vapor phase in order to connect the manipulator to the particle, wherein the deposition apparatus is further embodied to provide through the manipulator a particle beam that induces the deposition.

10. The apparatus of claim 9, wherein the apparatus comprises a separating apparatus, which is embodied to separate the removed particle from the manipulator.

11. The apparatus of claim 9, wherein the manipulator defines an opening.

12. The apparatus of claim 11, wherein a diameter of the opening of the manipulator is smaller than a diameter of a particle to be removed.

13. The apparatus of claim 11, wherein the diameter of the opening is within a range of 30 nm to 70 nm.

14. The apparatus of claim 11, wherein the opening has a form of a circle, a triangle, a rectangle or a square.

15. The apparatus of claim 9, further comprising a detector for detecting x-ray radiation.

16. The apparatus of claim 9, wherein the apparatus is embodied to provide at least one precursor gas for depositing connecting material at a position of the manipulator, in which the at least one precursor gas comprises at least one of ethene, styrene, pyrene, hexadecane, liquid paraffins, formic acid, acrylic acid, propionic acid, or methyl methacrylate.

* * * * *

UNITED STATES PATENT AND TRADEMARK OFFICE
CERTIFICATE OF CORRECTION

| | | |
|---|---|---|
| PATENT NO. | : 11,899,359 B2 | Page 1 of 1 |
| APPLICATION NO. | : 17/838520 | |
| DATED | : February 13, 2024 | |
| INVENTOR(S) | : Christof Baur and Hans Hermann Pieper | |

It is certified that error appears in the above-identified patent and that said Letters Patent is hereby corrected as shown below:

In the Specification

<u>Column 14</u>
Line 45, delete "and" and insert -- nor --

<u>Column 27</u>
Line 2, delete "$<10^4$" and insert -- $<10^{-4}$ --

Signed and Sealed this
Ninth Day of April, 2024

Katherine Kelly Vidal
*Director of the United States Patent and Trademark Office*